United States Patent
Kando

(10) Patent No.: US 7,151,424 B2
(45) Date of Patent: Dec. 19, 2006

(54) BOUNDARY ACOUSTIC WAVE DEVICE

(75) Inventor: Hajime Kando, Kyoto-fu (JP)

(73) Assignee: Murata Manufacturing Co., Ltd., Kyoto (JP)

(*) Notice: Subject to any disclaimer, the term of this patent is extended or adjusted under 35 U.S.C. 154(b) by 543 days.

(21) Appl. No.: 10/703,922

(22) Filed: Nov. 7, 2003

(65) Prior Publication Data

US 2005/0057323 A1 Mar. 17, 2005

(30) Foreign Application Priority Data

Nov. 8, 2002 (JP) .............................. 2002-325454

(51) Int. Cl.
*H03H 9/46* (2006.01)
*H03H 9/64* (2006.01)

(52) U.S. Cl. ................... 333/193; 310/313 B
(58) Field of Classification Search ........ 333/193–196; 310/313 B, 313 C, 313 D
See application file for complete search history.

(56) References Cited

U.S. PATENT DOCUMENTS

| | | | |
|---|---|---|---|
| 3,965,444 A * | 6/1976 | Willingham et al. ........ 333/155 |
| 4,342,012 A * | 7/1982 | Inaba et al. ............... 333/155 |
| 4,484,098 A * | 11/1984 | Cullen et al. ............. 310/313 A |
| 6,046,656 A * | 4/2000 | Mishima ..................... 333/141 |
| 6,737,941 B1 * | 5/2004 | Tournois .................... 333/193 |

FOREIGN PATENT DOCUMENTS

| | | |
|---|---|---|
| JP | 58-175315 | 10/1983 |
| JP | 2-47889 B2 | 10/1990 |
| JP | 06-112764 | 4/1994 |
| JP | 08-096105 | 4/1996 |
| JP | 10-335974 | * 12/1998 |

OTHER PUBLICATIONS

M. Yamaguchi et al., "Highly Piezoelectric Boundary Waves in Si/SiO$_2$/LiNbO$_3$ Structure", 1998 IEEE International Frequency Control Symposium, May 27-29, 1998, pp. 484-488.*
Yamashita Takashi et al.; "Highly Piezoelectric Boundary Method in Si/Si/O$_3$/LiNbO$_3$ Structural Propagation"; 26$^{th}$ EM Symposium, May 1997; pp. 53-58.

* cited by examiner

*Primary Examiner*—Barbara Summons
(74) *Attorney, Agent, or Firm*—Keating & Bennett, LLP

(57) ABSTRACT

A boundary acoustic wave device includes a first boundary acoustic wave element, and a second boundary acoustic wave element disposed on the first boundary acoustic wave element. Each boundary acoustic wave element includes a first solid layer made of a piezoelectric material, a second solid layer made of one of a piezoelectric material and an insulating material, and disposed on the first solid layer, and a boundary acoustic wave exciting interdigital transducer arranged in the boundary between the first and second solid layers.

23 Claims, 25 Drawing Sheets

BOUNDARY ACOUSTIC WAVE DEVICE

BACKGROUND OF THE INVENTION

1. Field of the Invention

The present invention relates to a boundary acoustic wave device using a boundary acoustic wave traveling in a boundary between two solid layers and, in particular, to a boundary acoustic wave device having a laminate structure in which one boundary acoustic wave element or one surface acoustic wave element is laminated to at least another boundary acoustic wave element.

2. Description of the Related Art

A variety of surface acoustic wave devices have been conventionally used for an RF filter and an IF filter for cellular phones, a VCO resonator, and a VIF filter for televisions. The surface acoustic wave devices use a surface acoustic wave such as a Reyleigh wave or a first leakage wave traveling along the surface of a medium.

The surface acoustic wave is sensitive to variations in the state of the surface of the medium because the surface acoustic wave travels along the surface of the medium. For this reason, the surface acoustic element is housed in a cavity of a package to protect the wave propagating surface of the medium. The use of the package having the cavity increases the cost of the surface acoustic wave device. In addition, since the package is substantially larger than the surface acoustic wave element, the size of the surface acoustic wave device is increased.

One type of surface acoustic waves travels along a boundary between solid bodies.

Japanese Unexamined Patent Application Publication No. 2-47899 discloses a surface acoustic wave device that uses a Stonley wave, which is one type of surface acoustic wave. FIG. 23 is a sectional view diagrammatically illustrating a surface acoustic wave device 500. An interdigital transducer (IDT) 502 is disposed on a glass substrate 501. A piezoelectric medium layer 503 made of zinc oxide (ZnO) covers the surface of the glass substrate 501 having the IDT 502 provided thereon. The thickness of each of the glass substrate 501 and the piezoelectric medium layer 503 is not less than five wavelengths of the surface acoustic wave, and the glass substrate 501 has a required density and modulus of rigidity. In this arrangement, a Stonley wave travels along the device.

The energy of the boundary acoustic wave concentrates in the boundary between the glass substrate 501 and the piezoelectric medium layer 503 in the surface acoustic wave device 500. Little or no energy of the surface acoustic wave exists on the surface 501a of the glass substrate 501 and the surface 503a of the piezoelectric medium layer 503. The surface 501a and the surface 503a respectively refer to the surfaces of the glass substrate 501 and the piezoelectric medium layer 503 that are opposite from the boundary surfaces thereof. Since there is little or no energy of the surface acoustic wave on the surface 501a of the glass substrate 501 and the surface 503a of the piezoelectric medium layer 503, the characteristics of the device are not sensitive to variations in the state of the surface 501a of the glass substrate 501 and the surface 503a of the piezoelectric medium layer 503. The surface acoustic wave device 500 disclosed in the above-described patent publication does not require a package having a cavity.

A leakage type boundary acoustic wave called a Maerfeld Tournois (MT) wave propagating in a [001]—Si(110)/SiO$_2$/X—LiNbO$_3$ structure is disclosed in a non-patent document entitled "Highly Piezoelectric Boundary Method in Si/SiO$_3$/LiNbO$_3$ Structural Propagation", 26$^{th}$ EM Symposium, May 1997, pp. 53–58. The boundary acoustic wave of this type has an electromechanical coupling factor $k^2$ that is greater than the Stonley wave. FIG. 24 is a sectional view illustrating a boundary acoustic wave device 510 disclosed in the above-mentioned non-patent document. An IDT 512 is disposed on a Y—X LiNbO$_3$ substrate 511 in the boundary acoustic wave device 510. An SiO$_2$ layer 513 covers the IDT 512. A [001]—Si(100) layer 514 is then disposed on the SiO$_2$ layer 513.

Since the MT wave is a boundary acoustic wave, the boundary acoustic wave device 510 using the MT wave does not require a package having a cavity.

As cellular phones with multiple functions become smaller, flatter, and lighter, miniaturization of electronic components is accordingly required. For example, area requirements of flat RF interstage SAW filters were 3.8 by 3.8 mm$^2$ in 1998, 3.0 by 3.0 mm$^2$ in 2000, and 2.0 by 1.6 mm$^2$ or less in 2002. In the future, area requirements are expected to be less than 1 mm$^2$.

Since the package has no cavity, the above-referenced boundary acoustic wave devices have dimensional advantages over the other devices. However, in the known boundary acoustic wave devices, the dimensions of the element remains unchanged from the known surface acoustic wave devices. Further miniaturization is thus impossible. FIG. 25 is a plan sectional view illustrating electrodes of a 1 GHz band RF interstage filter that is designed in accordance with the known boundary acoustic wave device. As shown, a boundary surface bearing the electrodes is exposed in the sectional view.

As shown in FIG. 25, a number of IDTs 523a–523e, reflectors 524a–524j, electrode pads 525a–525c, and wiring electrodes must be disposed on the top surface of a solid layer 522 made of an LiNbO$_3$ substrate in a boundary acoustic wave device 521 to manufacture the 1 GHz band RF interstage filter. These elements make it difficult to miniaturize the two dimensional area of the boundary acoustic wave device to less than 1 mm$^2$.

SUMMARY OF THE INVENTION

To overcome the problems described above, preferred embodiments of the present invention provide a boundary acoustic wave device that satisfies miniaturization requirements of element size and has excellent characteristics and performance.

In a first preferred embodiment of the present invention, a boundary acoustic wave device includes a laminate of a plurality of boundary acoustic wave elements, wherein each boundary acoustic wave element includes a first solid layer made of a piezoelectric material, a second solid layer disposed on the first solid layer and made of one of a piezoelectric material and an insulating material, and a boundary acoustic wave exciting interdigital transducer disposed in a boundary between the first and second solid layers.

In a second preferred embodiment of the present invention, a boundary acoustic wave device includes a first solid layer made of a piezoelectric material, a second solid layer disposed on the first solid layer and made of one of a piezoelectric material and an insulating material, a boundary acoustic wave exciting interdigital transducer disposed in a boundary between the first and second solid layers, and a surface acoustic wave exciting interdigital transducer disposed on the surface of the first solid layer.

A surface acoustic wave element is preferably disposed on the external surface of the laminate, wherein the surface acoustic wave element includes a piezoelectric body and a surface acoustic wave exciting interdigital transducer disposed on one surface of the piezoelectric body. Since the surface acoustic wave element is arranged on the external surface, an even smaller device with multiple functions is provided.

The boundary acoustic wave device may further include a conductive layer disposed at at least one of an external surface of the laminate, a boundary between adjacent boundary acoustic wave elements, and a location between one of the boundary acoustic wave elements and the external surface of the laminate. This arrangement controls direct-path electromagnetic waves traveling between the boundary acoustic wave elements, thereby assuring a large attenuation in a filter.

The boundary acoustic wave device preferably includes an acoustic wave absorbing layer disposed at at least one of an external surface of the laminate, a boundary between adjacent boundary acoustic wave elements, and a location between one of the boundary acoustic wave elements and the external surface of the laminate. This arrangement enables direct-path acoustic waves to be absorbed, thereby controlling crosstalk between the boundary acoustic wave elements. If a filter is constructed in this arrangement, aging of the filter characteristics is controlled.

The boundary acoustic wave device preferably includes a third solid layer having an acoustic impedance that is different from the first and second solid layers, disposed at at least one of an external surface of the laminate, a boundary between adjacent boundary acoustic wave elements, and a location between one of the boundary acoustic wave elements and the external surface of the laminate. The third solid layer having a different acoustic impedance reflects direct-path acoustic waves, thereby controlling crosstalk between the boundary acoustic wave elements. A filter having this arrangement is less susceptible to aging in the filter characteristics.

Preferably, a boundary between the solid layers, other than the boundary having the boundary acoustic wave exciting interdigital transducer, is not as flat as the surface having the surface acoustic wave exciting interdigital transducer. Direct bulk waves and unwanted bulk waves reflected from the boundary are controlled because the boundary between the solid layers other than the boundary having the boundary acoustic wave exciting interdigital transducer is not flat.

The boundary acoustic wave exciting interdigital transducer disposed on one boundary acoustic wave element is preferably shifted in position in a laminating direction from the boundary acoustic wave exciting interdigital transducer disposed on another boundary acoustic wave element. Direct electromagnetic waves are controlled, thereby increasing an attenuation in a filter having that arrangement. Direct-path capacitance is thus greatly reduced.

Preferably, the boundary acoustic wave device further includes an inductance element connected between the boundary acoustic wave exciting interdigital transducers of different boundary acoustic wave elements. Parallel resonance reduces direct-path capacitance in the vicinity of a passband of the filter. Outstanding filter characteristics are thus achieved.

Preferably, the boundary acoustic wave device further includes at least two boundary acoustic wave elements electrically connected to each other through a through-hole electrode provided in the laminate, wherein an elastic material fills the inside of the through-hole electrode. The use of at least two boundary acoustic wave elements electrically connected to each other through the through-hole electrode enables the surface of the boundary acoustic wave element to be planarized. The processing of the element is greatly simplified. Unwanted reflection of the acoustic waves is greatly reduced and minimized. The elastic material filling the inside of the through-hole electrode controls gas explosions within the through-hole during heating.

The boundary acoustic wave device preferably includes at least two boundary acoustic wave elements electrically connected to each other through a through-hole electrode arranged in the laminate, the through-hole electrode includes a plurality of through-hole electrode sections, upper and lower through-hole electrode sections are arranged at different positions in a plane at a height within the laminate, and the two through-hole electrode sections are electrically connected to each other through an electrical connection junction extending in the plane. If the upper and lower through-hole electrode sections are arranged at different positions in a plane at the height within the laminate, corrosion that begins in the vicinity of the through-hole is controlled. Thus, the device is corrosion resistant and moisture resistant.

At least two boundary acoustic wave elements are preferably electrically connected to each other via a wiring electrode arranged on the external surface of the laminate. In this case, the wiring electrode is easily formed. The device prevents unwanted reflection of the acoustic waves, which waves are generated if a through-hole electrode is provided.

The laminate preferably includes a step on the external surface thereof, wherein the wiring electrode is disposed on the step. The formation of the step increases the reliability of the electrical connection of the IDT arranged on the wiring electrode and the boundary surface. A collective wiring method is performed in a wafer process.

Preferably, the boundary acoustic wave device further includes a temperature characteristic improving layer disposed at at least one of an external surface of the laminate, a boundary between adjacent boundary acoustic wave elements, and a location between one of the boundary acoustic wave elements and the external surface of the laminate, wherein the temperature characteristic improving layer has a linear expansion coefficient in a direction that is substantially parallel to the boundary plane of the boundary acoustic wave element having the boundary acoustic wave exciting interdigital transducer therein that is less than a linear expansion coefficient of the first and second solid layers of the boundary acoustic wave element, or has a linear expansion coefficient that is different in polarity from the linear expansion coefficient of the first and second solid layers. The use of the temperature characteristic improving layer greatly improves the temperature characteristics of the boundary acoustic wave device.

Preferably, the boundary acoustic wave device includes a high thermal conductivity layer, disposed at at least one of an external surface of the laminate, a boundary between adjacent boundary acoustic wave elements, and a location between one of the boundary acoustic wave elements and the external surface of the laminate, wherein the high thermal conductivity layer has a greater thermal conductivity than an adjacent boundary acoustic wave element. In this arrangement, heat dissipation and power withstand ability of the boundary acoustic wave device are greatly improved.

The boundary acoustic wave elements may be bonded together using a cavity forming member such that a cavity is provided in at least one of the boundaries of the boundary acoustic wave elements. The boundary acoustic wave elements may be bonded together directly or with the cavity forming member interposed therebetween.

The boundary acoustic wave device preferably includes a circuit element disposed at at least one of an external surface of the laminate, a boundary between adjacent boundary acoustic wave elements, and a location between one of the boundary acoustic wave elements and the external surface of the laminate. The formation of the circuit element between the boundary acoustic wave elements or on the external surface of the laminate permits an impedance matching circuit to be incorporated in the boundary acoustic wave device. The boundary acoustic wave device having multiple functions is thus provided.

The boundary acoustic wave device may further include a base substrate which defines a stress relaxation body and on which the laminate is mounted. Stress due to the bending of a printed circuit board is greatly reduced by the base substrate. Variations in the characteristics of the boundary acoustic wave device are effectively controlled, and the reliability of the boundary acoustic wave device is greatly improved.

The base substrate may be made of a material that is harder than the first and second solid layers which define the boundary acoustic wave element.

The thickness of each of the first and second solid layers is preferably equal to or greater than the wavelength of a boundary acoustic wave. In the arrangement, little or no boundary acoustic wave energy exists on the surfaces of the first and second solid layers.

In another preferred embodiment of the present invention, a method for manufacturing a boundary acoustic wave device includes a step of manufacturing the boundary acoustic wave element by laminating the first solid layer made of the piezoelectric material and the second solid layer made of the one of the piezoelectric material and the insulating material, with a boundary acoustic wave exciting interdigital transducer being interposed therebetween, repeating the step of manufacturing the boundary acoustic wave element to produce a plurality of boundary acoustic wave substrates, and producing a laminate by laminating the plurality of boundary acoustic wave elements.

The method preferably includes a step for providing an acoustic wave absorbing layer at at least one of an external surface of the laminate, a boundary between adjacent boundary acoustic wave elements, and a location between one of the boundary acoustic wave elements and the external surface of the laminate, wherein the acoustic wave absorbing layer is degassed when the first and second solid layers are bonded together with the acoustic wave absorbing layer and the boundary acoustic wave exciting interdigital transducer interposed therebetween. Alternatively, the acoustic wave absorbing layer is degassed when the boundary acoustic wave elements are bonded together via the acoustic wave absorbing layer interposed therebetween.

Since the acoustic wave absorbing layer is degassed, the device does not experience problems arising from residual gases. If any gas remains in a resin of the acoustic wave absorbing layer, cracks may occur in the boundary acoustic wave device during a reflow operation. Degassing over time changes stress in the boundary acoustic wave element, causing the frequency characteristics of the device to age. If the acoustic wave absorbing layer is degassed beforehand, the device does not experience these problems.

The above and other elements, characteristics, features, steps and advantages of the present invention will become clear from the following description of preferred embodiments taken in conjunction with the accompanying drawings.

DETAILED DESCRIPTION OF PREFERRED EMBODIMENTS

Preferred embodiments of the present invention will now be described.

Figure 1:
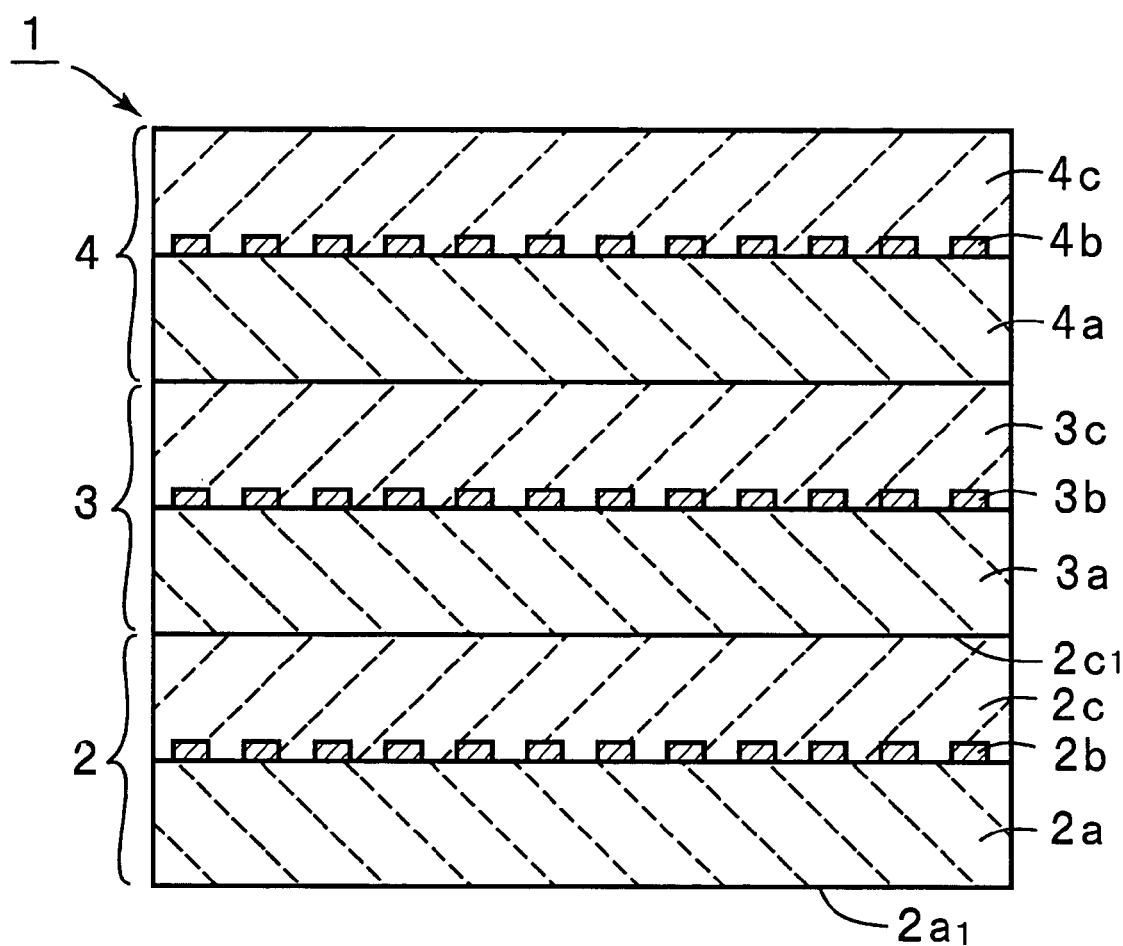
FIG. 1 is a front sectional view illustrating a boundary acoustic wave device in accordance with a first preferred embodiment of the present invention.

FIG. 1 is a front sectional view illustrating a boundary acoustic wave device 1 in accordance with a first preferred embodiment of the present invention. The boundary acoustic wave device 1 includes a laminate structure including a plurality of boundary acoustic wave elements 2–4. The boundary acoustic wave elements 2–4 are laminated such that boundary acoustic wave propagating surfaces thereof are substantially parallel with each other. If the elements 2–4 are bonded using a bonding agent, the boundary acoustic wave propagating surfaces of upper and lower boundary acoustic wave elements will not be parallel to each other due to variations in thickness of the bonding agent. The boundary acoustic wave propagating surfaces may have an angle of ±30 degrees therebetween. In the first preferred embodiment, the boundary acoustic wave elements 2–4 are preferably identically manufactured. In the boundary acoustic wave element 2, an IDT 2b is disposed on a first solid layer 2a. A second solid layer 2c is disposed on the first solid layer 2a having the IDT 2b thereon. In other words, the IDT 2b is provided in the boundary between the first and second solid layers 2a and 2c.

The first solid layer 2a is preferably made of a lithium niobate ($LiNbO_3$) monocrystal, in the first preferred embodiment. Besides the lithium niobate monocrystal, the first solid layer 2a may be made of a piezoelectric monocrystal, or a piezoelectric ceramic, or other suitable material. The first solid layer 2a is made of any suitable piezoelectric material.

The material of the IDT 2b is not limited to any particular material. For example, the IDT 2b is made of any suitable metal, such as aluminum (Al) or copper (Cu), or any alloy. The IDT 2b is preferably made of aluminum in the first preferred embodiment.

The second solid layer 2c is preferably made of one of a piezoelectric material and an insulating material. The second solid layer 2c is preferably made of silicon dioxide ($SiO_2$) in the first preferred embodiment. A piezoelectric monocrystal such as lithium niobate or a piezoelectric ceramic may be used as the piezoelectric material. Glass or any other appropriate insulating material other than silicon dioxide may be used as the insulating material.

The boundary acoustic wave elements 3 and 4, which are preferably substantially identical in structure to the boundary acoustic wave element 2, respectively include a first solid layer 3a, an IDT 3b, and a second solid layer 3c, and a first solid layer 4a, an IDT 4b, and a second solid layer 4c.

A boundary acoustic wave is excited in the boundary between the first solid layers 2a and 2c when an alternating current is applied to the IDT 2b. Most of the energy of the boundary acoustic wave concentrates in a region of a thickness that is substantially equal to a wavelength $\lambda$ from the boundary between the first and second solid layers 2a and 2c. The wavelength $\lambda$ is that of the excited boundary acoustic wave.

Almost all energy of the boundary acoustic wave device is confined to a region within a thickness range of about $\lambda$ to about $3\lambda$ from the boundary. The thickness of the solid layers 2a and 2c is preferably at least about $\lambda$, and more preferably at least about $3\lambda$.

The boundary acoustic wave is not adversely affected by the state of the surfaces $2a_1$ and $2c_1$ of the first and second solid layers 2a and 2c if the thickness of the first and second solid layers 2a and 2c is greater than about $\lambda$ or greater than about $3\lambda$.

The surfaces $2a_1$ and $2c_1$ of the first and second solid layers 2a and 2c are those of the first and second solid layers 2a and 2c opposite to the boundary of the first and second solid layers 2a and 2c. In the discussion that follows, the surface of the solid layer refers to the surface opposite to the acoustic wave propagating boundary.

The boundary acoustic wave used in preferred embodiments of the present invention includes but is not limited to the above-mentioned Stonley wave and the MT wave.

Figure 25:
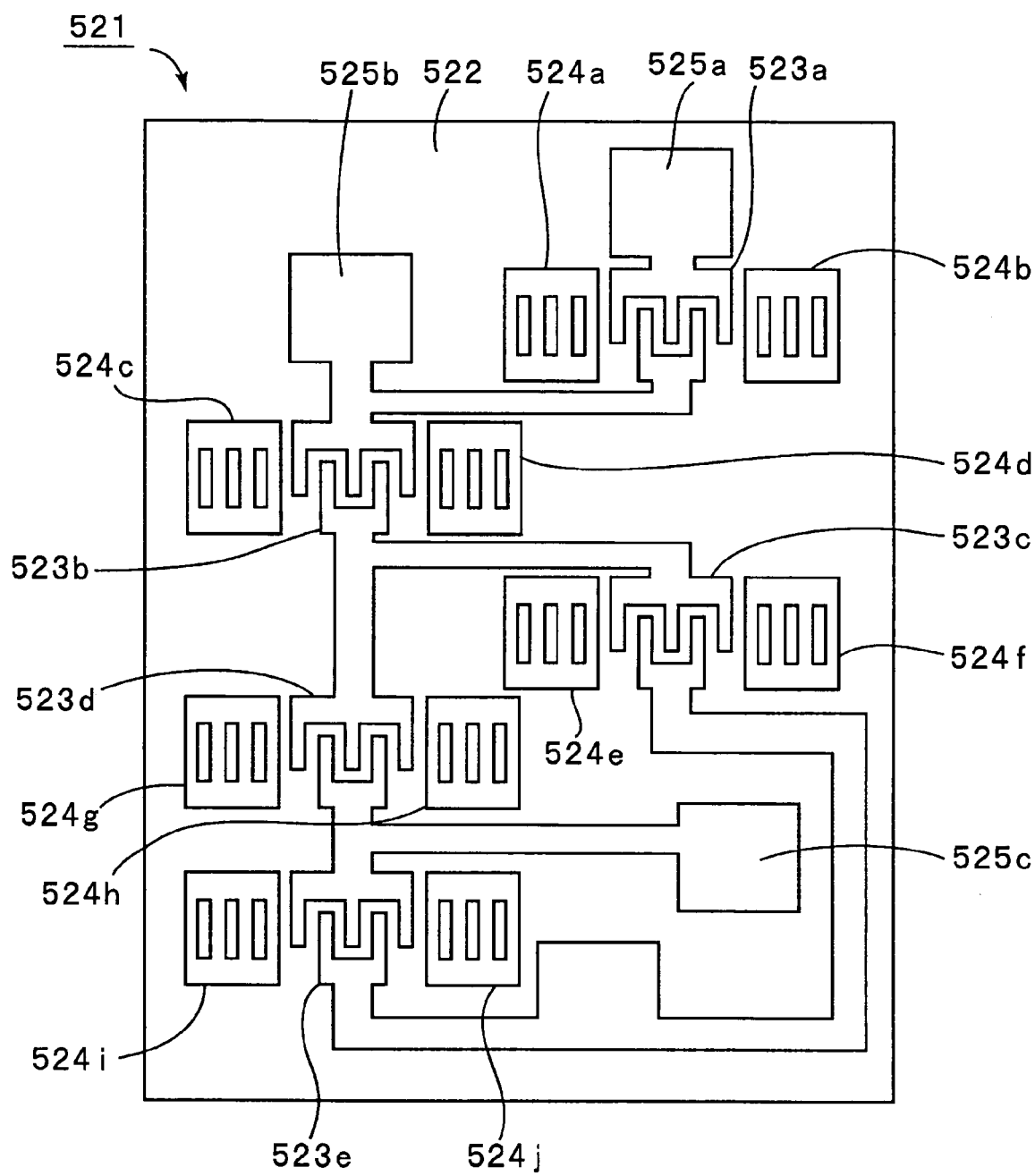
FIG. 25 is a plan sectional view illustrating the layout of electrodes in a band pass filter incorporating a known boundary acoustic wave device.

The boundary acoustic wave device 1 of the first preferred embodiment, including the laminate structure of the plurality of boundary acoustic wave elements 2–4, achieves an area dimension that is less than the boundary acoustic wave device 521 illustrated in FIG. 25.

The acoustic speed of the boundary acoustic wave is about 2,000 m/s to about 10,000 m/s. If the boundary acoustic wave device 1 is operated at a frequency of about 1 GHz, the wavelength of the wave is within a range of about 2 µm to about 10 µm. If the boundary acoustic wave elements 2–4 are laminated, an increase in overall thickness of the device is not a problem. Without a significant thickness increase, a boundary acoustic wave device having a very small area is achieved.

A manufacturing method of the boundary acoustic wave device 1 will now be described. The IDT 2b preferably made of aluminum is formed on the first solid layer 2a made of the $LiNbO_3$ substrate using a photolithographic technique. The silicon dioxide layer is deposited preferably using the RF magnetron sputter deposition. The silicon dioxide layer is planarized using an etch-back technique. The second solid layer 2c, made of silicon dioxide, is preferably formed in this manner.

The surface $2c_1$ of the second solid layer 2c is preferably planarized for the following reason. If the silicon dioxide layer is deposited after the formation of the IDT 2b, the surface of the silicon dioxide layer is not flat because of the height of the IDT 2b. If the silicon dioxide layer is not flat, the IDT bearing surface of the first solid layer 3a of the boundary acoustic wave element 3 to be produced next is also not flat. Thus, the boundary of the second boundary acoustic wave element 3 is not flat. The surface $2c_1$ of the second solid layer 2c is thus planarized.

The first solid layer 3a is made of lithium niobate using the laser ablation. The IDT 3b is preferably formed by depositing aluminum, and the silicon dioxide layer is deposited using the RF magnetron sputter deposition, and then planarized using the etch-back technique. In this way, the boundary acoustic wave element 3 is laminated on the boundary acoustic wave element 2. Similarly, the boundary acoustic wave element 4 is laminated on the boundary acoustic wave element 3, thereby completing the boundary acoustic wave device 1.

A thickness of at least about 100λ of the first solid layer 2a of the boundary acoustic wave element 2 preferably made of the lithium niobate monocrystal substrate is sufficient. The thickness of the first solid layer 3a and the first solid layer 4a, preferably made of lithium niobate, is about 10λ, the thickness of the second solid layers 2c, 3c, and 4c, made of silicon dioxide, is about 10λ, and the thickness of the IDTs is about 0.02λ. The overall thickness of the boundary acoustic wave device 1 is about 150λ.

Figure 2:
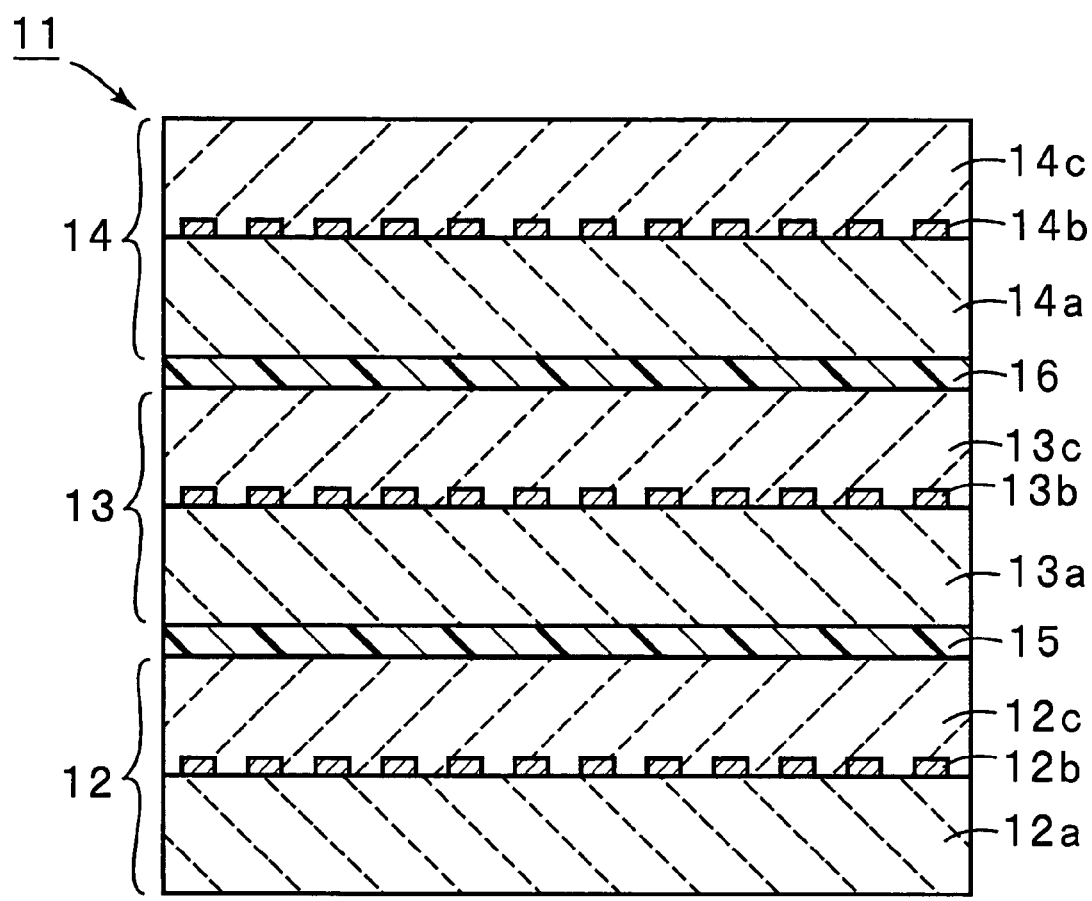
FIG. 2 is a front sectional view illustrating a boundary acoustic wave device in accordance with a second preferred embodiment of the present invention.

FIG. 2 is a front sectional view illustrating a boundary acoustic wave device 11 in accordance with a second preferred embodiment of the present invention. The boundary acoustic wave device 11 includes boundary acoustic wave elements 12–14. In the second preferred embodiment, first solid layers 12a, 13a, and 14a of the boundary acoustic wave elements 12–14 are preferably made of zinc oxide, and second solid layers 12c, 13c, and 14c are preferably made of borosilic acid glass. IDT 12b, IDT 13b, and IDT 14b are preferably made of aluminum.

In the second preferred embodiment, the boundary acoustic wave elements 12–14 are bonded together using epoxy based bonding agents 15 and 16 including a silver filler after each of the boundary acoustic wave elements 12–14 is produced. The laminated boundary acoustic wave device 11 is thus provided. In the first preferred embodiment, the laminate is produced by successively forming the boundary acoustic wave elements. In the second preferred embodiment, the boundary acoustic wave elements 12–14 are bonded together for lamination after each of the elements 12–14 is produced.

The thickness of the first solid layers 12a, 13a, and 14a is not limited to a particular dimension, but is about 30 λ, for example. The thickness of the first solid layers 12a, 13a, and 14a, made of zinc oxide, is about 10 λ, and the thickness of the IDTs 12b, 13b, and 14b is about 0.02 λ.

To bond the boundary acoustic wave devices, the bonding agent is applied on one of the boundary acoustic wave elements using spin coating under room temperature. In a vacuum, the bonding agent is degassed, and another boundary acoustic wave element is attached to the first boundary acoustic wave element. The device with the bonding agent is then heated and cured at a temperature of about 150° C.

In the second preferred embodiment, the epoxy based bonding agents 15 and 16 are preferably used. Another bonding agent may be used to bond the plurality of boundary acoustic wave elements. The bonding agent not only bonds the boundary acoustic wave elements, but also absorbs bulk waves leaked from the boundary acoustic wave element. In other words, the bonding agent functions as and defines an acoustic wave absorbing layer. The bonding agent defining an acoustic wave absorbing layer is not limited to the epoxy based bonding agent. The bonding agent may be an agent including an appropriate material having a large propagation loss to acoustic waves as a major component, for example, a silicone based bonding agent, a urethane based bonding agent, and a polyimide based bonding agent, or other suitable bonding agent.

In the second preferred embodiment, the epoxy based bonding agents 15 and 16 preferably include a silver filler. The bonding agent including an electrically conductive filler such as silver controls direct-path electromagnetic waves between adjacent boundary acoustic wave elements.

The particle diameter of the filler in the bonding agent defining an acoustic wave absorbing layer is important. When the particle diameters become large, the acoustic wave absorbing layer becomes thick. If the amount of leakage of bulk waves is small, the acoustic wave absorbing layer may be thin, with the particle diameter being in a range of about 1 to about 20 μm. Conversely, if the amount of leakage of bulk waves is large, the acoustic wave absorbing layer may be thick, with the filler particle diameter being in the range of about 10 μm to about 100 μm.

If the filler is a metal, such as silver, having a thermal conductivity higher than the solid layer of the boundary acoustic wave element, thermal conductivity between adjacent boundary acoustic wave elements is increased. Heat dissipation of the entire boundary acoustic wave device 11 increases, a temperature increase is reduced at the input of high power, and power withstand ability is greatly improved.

Generally, the boundary acoustic wave is reflected from the boundary if the acoustic wave propagates across media having different acoustic impedances. In the boundary acoustic wave device 11, the epoxy based bonding agents 15 and 16 have different acoustic impedances from adjacent boundary acoustic wave elements. The epoxy based bonding agents 15 and 16 reduce the amount of leakage of acoustic waves between the adjacent boundary acoustic wave elements.

More specifically, the bonding agent 15, disposed between the second solid layer 12c of the boundary acoustic wave element 12 and the first solid layer 13a of the boundary acoustic wave element 13, controls the leakage of the acoustic waves between the second solid layer 12c and the first solid layer 13a.

The acoustic impedance per unit volume depends on the density and Young's modulus of the material. To make the acoustic impedance different, the density and/or the Young's modulus of the epoxy based bonding agents 15 and 16 are different from those of the solid layers in contact with the epoxy based bonding agents 15 and 16.

As already discussed, the epoxy based bonding agents 15 and 16 not only bond the boundary acoustic wave elements 12–14, but also function as an acoustic wave absorbing layer including a conductive filler, as a high thermal conductivity layer including a metal filler, and as an acoustic wave reflecting layer having a different acoustic impedance. It is not a requirement that the epoxy based bonding agents 15 and 16 have all of the functions described above. The epoxy based bonding agents 15 and 16 may have one or more of the three functions.

A layer functioning as at least one of the acoustic wave absorbing layer, the high thermal conductivity layer, and the acoustic wave reflecting layer may be interposed instead of the bonding agent. In such a case, a bonding agent may also be used for the bonding purpose only.

Figure 3:
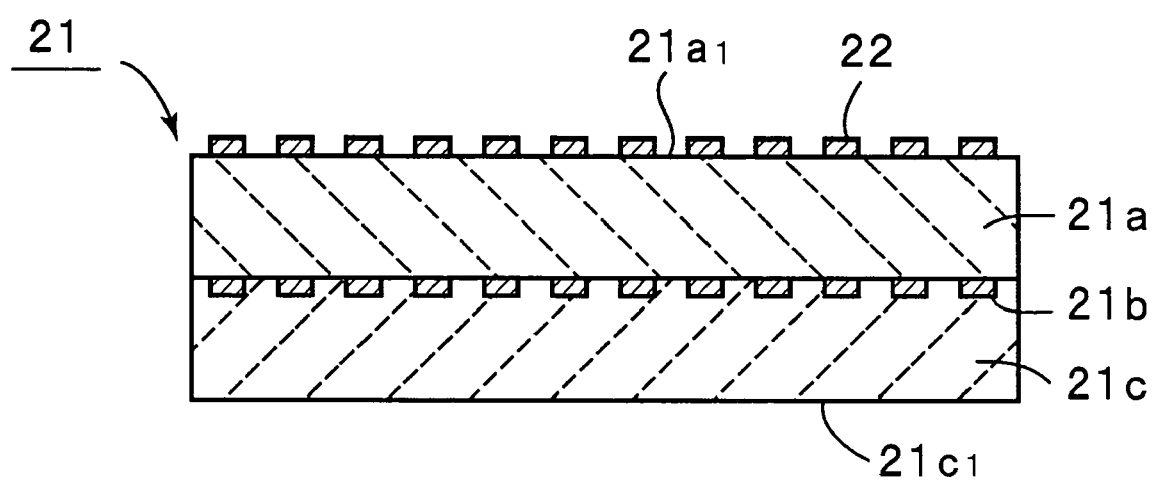
FIG. 3 is a front sectional view illustrating a boundary acoustic wave device in accordance with a third preferred embodiment of the present invention.

FIG. 3 is a front sectional view illustrating a boundary acoustic wave device 21 in accordance with a third preferred embodiment of the present invention.

The boundary acoustic wave device 21 includes a first solid layer 21a made of a piezoelectric material, an IDT 21b, and a second solid layer 21c made of an insulating material. The first solid layer 21a, the IDT 21b, and the second solid layer 21c may be respectively identical in structure to the first solid layer 2a, the IDT 2b, and the second solid layer 2c in the boundary acoustic wave element 1 of the first preferred embodiment. The upper and lower positional relationship between the first and second solid layers 21a and 21c shown in FIG. 3 is reversed from that of the first and second solid layers 2a and 2c shown in FIG. 1.

The third preferred embodiment includes a surface acoustic wave exciting IDT 22 that is disposed on a top surface $21a_1$ of the first solid layer 21a. In other words, in the boundary acoustic wave device 21, the surface acoustic wave exciting IDT 22 is combined with the boundary acoustic wave element including the first and second solid layers 21a and 21c, and the boundary acoustic wave exciting IDT 21b. Since the boundary acoustic wave element and the surface acoustic wave element are combined, the boundary acoustic wave device 21 which performs multiple functions is miniaturized.

In this way, a surface acoustic wave device may be integrated by providing a surface acoustic wave exciting interdigital transducer on a first solid layer made of a piezoelectric material in preferred embodiments of the present invention.

The surface acoustic wave exciting IDT 22 is disposed on the surface $21a_1$ of the first solid layer 21a in the boundary acoustic wave device 21. If the second solid layer 21c is made of a piezoelectric material, a surface acoustic wave exciting IDT may also be disposed on a surface $21c_1$ of the second solid layer 21c.

Figure 4:
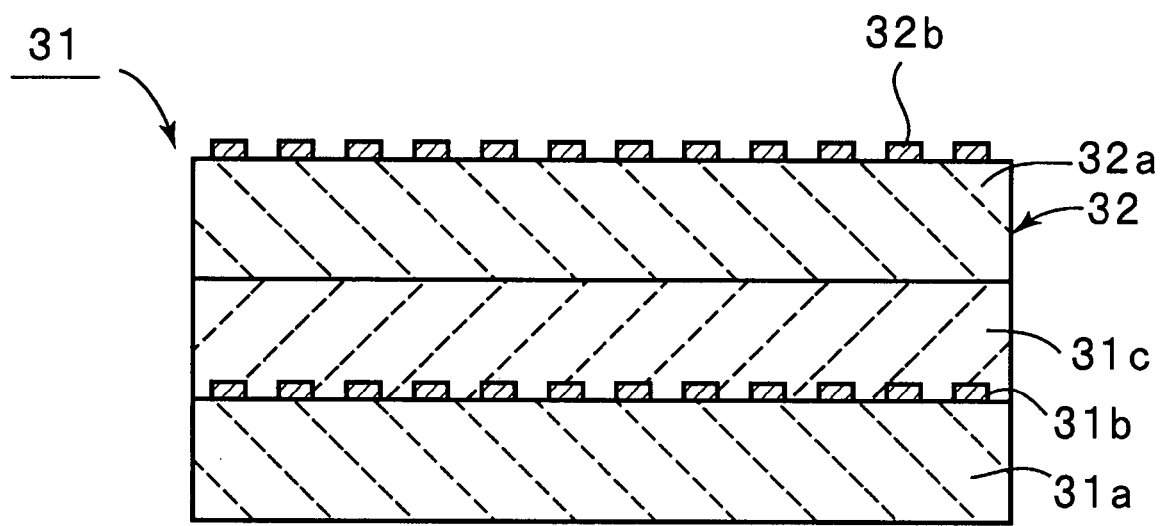
FIG. 4 is a front sectional view illustrating a boundary acoustic wave device in accordance with a fourth preferred embodiment of the present invention.

FIG. 4 is a front sectional view illustrating a boundary acoustic wave device 31 in accordance with a fourth preferred embodiment of the present invention.

The boundary acoustic wave device 31 includes a surface acoustic wave element 32 laminated on a boundary acoustic wave element including a first solid layer 31a, an IDT 31b, and a second solid layer 31c. The surface acoustic wave element 32 includes a surface acoustic wave substrate 32a and an IDT 32b provided on the surface acoustic wave substrate 32a. The surface acoustic wave substrate 32a may be configured to include a piezoelectric substrate and a piezoelectric thin film disposed on the piezoelectric substrate or may be configured to include an insulating substrate and a piezoelectric thin film disposed on the insulating substrate.

As shown in FIG. 4, a surface acoustic wave element may be disposed on a boundary acoustic wave element in preferred embodiments of the present invention. The boundary acoustic wave device 31, including the boundary acoustic wave element and the surface acoustic wave element, produces a boundary acoustic wave device having very small dimensions and multiple functions.

A boundary acoustic wave device 51 of a fifth preferred embodiment of the present invention will now be discussed with reference to FIGS. 5A and 5B, and FIGS. 6–9.

Figures 5A, 5B:
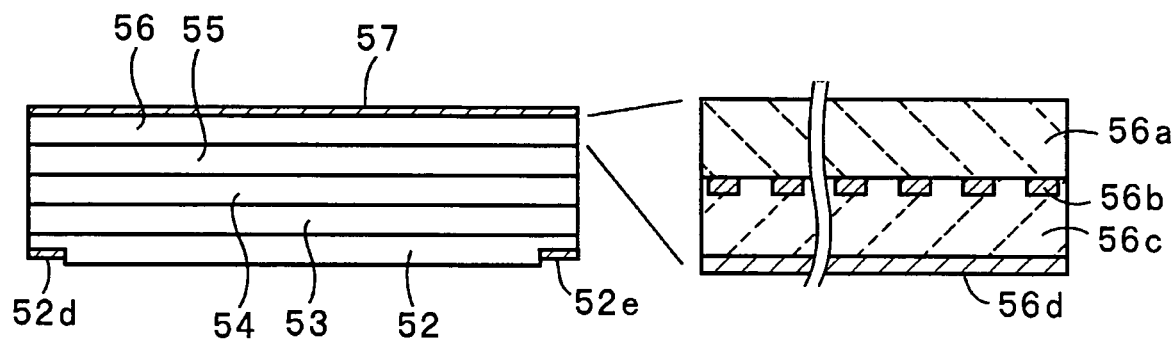
FIG. 5A is a front sectional view of a boundary acoustic wave device of a fifth preferred embodiment of the present invention.
FIG. 5B is an enlarged front sectional view of a major portion of the boundary acoustic wave device shown in FIG. 5A.

FIGS. 5A and 5B are front sectional views of the boundary acoustic wave device 51 of the fifth preferred embodiment of the present invention. The boundary acoustic wave device 51 includes boundary acoustic wave elements 52–56. The boundary acoustic wave element 56, shown in enlargement in FIG. 5B, includes a laminate structure including a first solid layer 56a, an IDT 56b, a second solid layer 56c, and an electrically conductive layer 56d. The electrically conductive layer 56d covers a surface $56c_1$ of the second solid layer 56c. The other boundary acoustic wave elements 52–55 preferably have substantially identical structure to the boundary acoustic wave element 56. As shown in FIG. 5A, an electrically conductive film 57 is disposed on the boundary acoustic wave element 56 to provide electromagnetic shielding.

Figure 6:
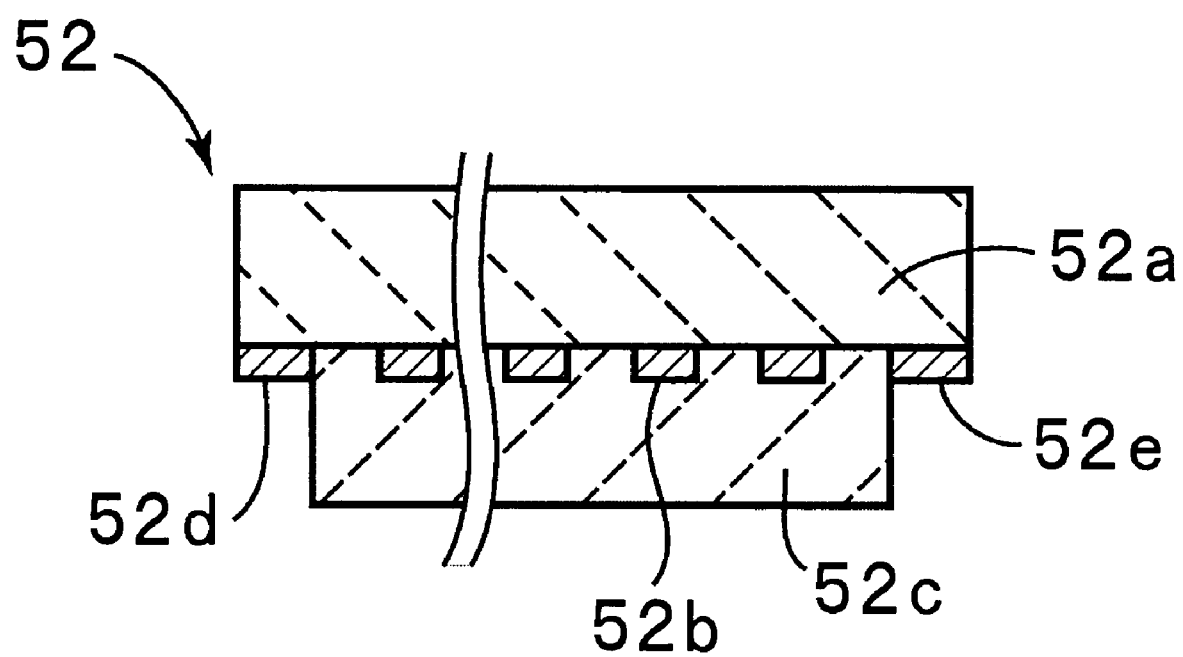
FIG. 6 is an enlarged sectional view of a boundary acoustic wave element arranged in a bottom portion of the boundary acoustic wave device of the fifth preferred embodiment of the present invention.

As shown in FIG. 6, the second solid layer 52c is smaller in area than the first solid layer 52a in a lower portion of the boundary acoustic wave element 52. A portion of the boundary surface of the first solid layer 52a is thus exposed. Electrode pads 52d and 52e are arranged on the exposed portions. The electrode pads 52d and 52e are arranged to provide electrical connection to the outside.

Figure 7A:
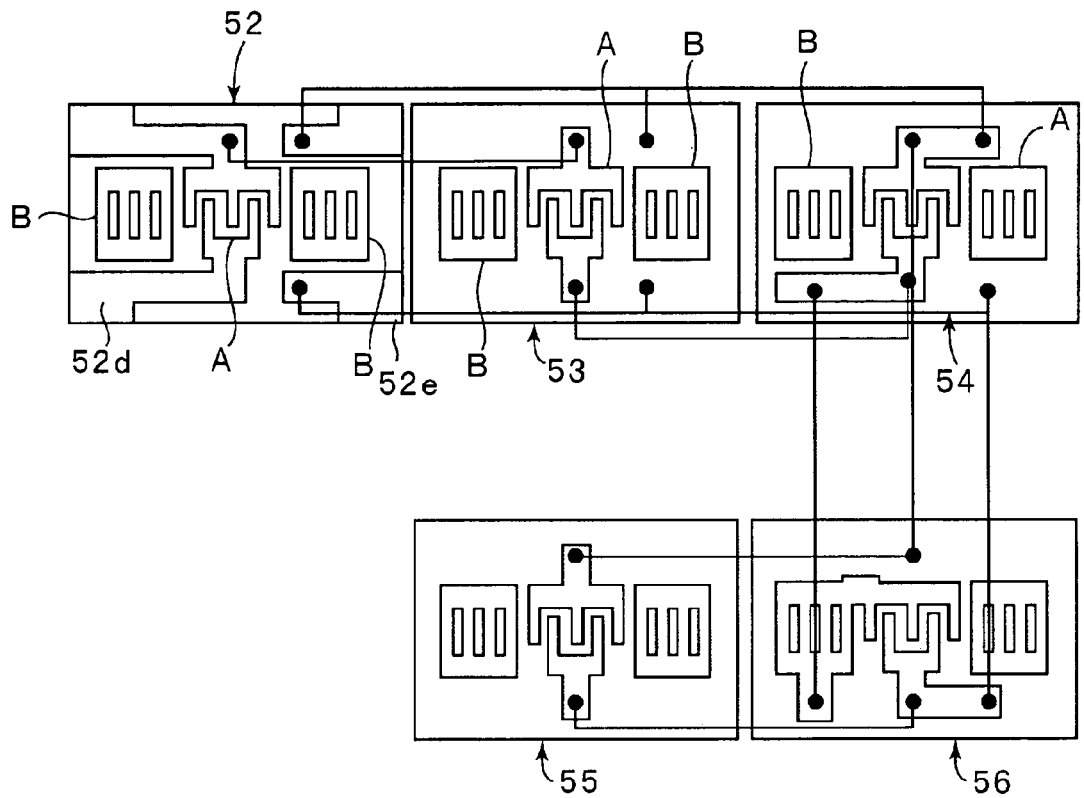
FIGS. 7A–7C are plan views diagrammatically illustrating the layout of electrodes of the boundary acoustic wave device of the fifth preferred embodiment of the present invention.
Figure 7B:
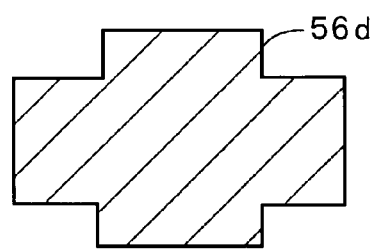
Figure 7C:
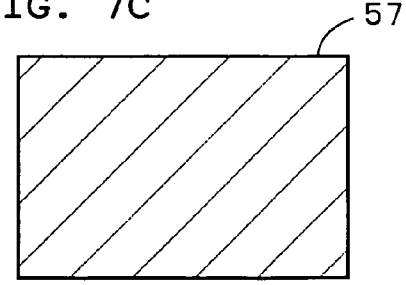

FIGS. 7A–7C are plan views diagrammatically illustrating the configuration of electrodes and electrical connections provided in each of the boundaries of the boundary acoustic wave elements 52–56 of the boundary acoustic wave device 51. FIGS. 7B and 7C are plan views illustrating the shapes of conductive layers 56d and 57.

Figure 8:
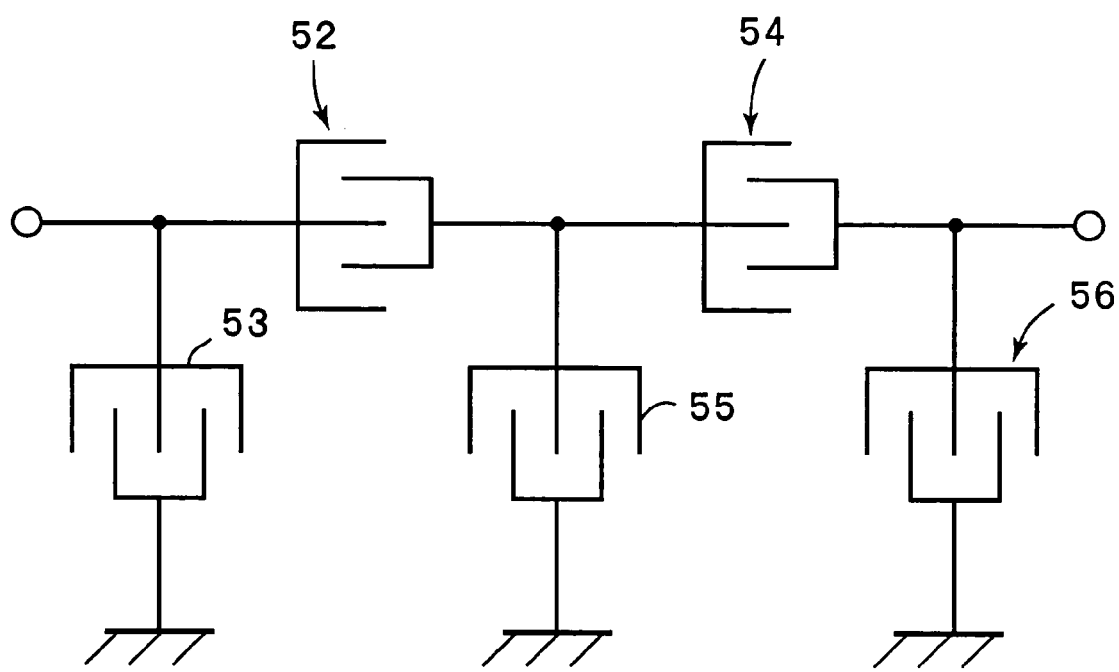
FIG. 8 is a circuit diagram of the boundary acoustic wave device of the fifth preferred embodiment of the present invention.

More specifically, each of the boundary acoustic wave elements 52–56 includes an IDT and reflectors arranged on both sides of the IDT along a direction of propagation of surface acoustic wave as shown in FIG. 7A. As shown, the letter A represents the IDT, and the letter B represents the reflectors. In other words, each of the boundary acoustic wave elements 52–56 is a one-port type boundary acoustic wave resonator. As shown, the boundary acoustic wave elements 52–56 are electrically connected to provide a ladder type filter. FIG. 8 is a circuit diagram of the ladder type filter.

In accordance with preferred embodiments of the present invention, a plurality of boundary acoustic wave elements are laminated to define a complex circuit such as a ladder type filter without increasing a chip area dimension.

The circuit arrangement shown in FIGS. 7A–7C and FIG. 8 is identical to the circuit arrangement of the known boundary acoustic wave device shown in FIG. 25. The fifth preferred embodiment provides a chip size of about 0.6×0.4 mm$^2$, which is one-eighth the area of the known device shown in FIG. 25. Substantial miniaturization is thus achieved.

The first and second solid layers and the IDTs of the boundary acoustic wave elements 52–56 preferably have substantially identical structure to that of the boundary acoustic wave element 2 in the first preferred embodiment.

If an input IDT and an output IDT overlap in the laminate of a plurality of boundary acoustic wave elements as in the fifth preferred embodiment, a strong electromagnetic wave signal may be transmitted from the input IDT to the output IDT in a direct-path propagation. If the electromagnetic wave signal propagating in direct path is strong, out-of-band attenuation is reduced in the filter.

Figure 10:
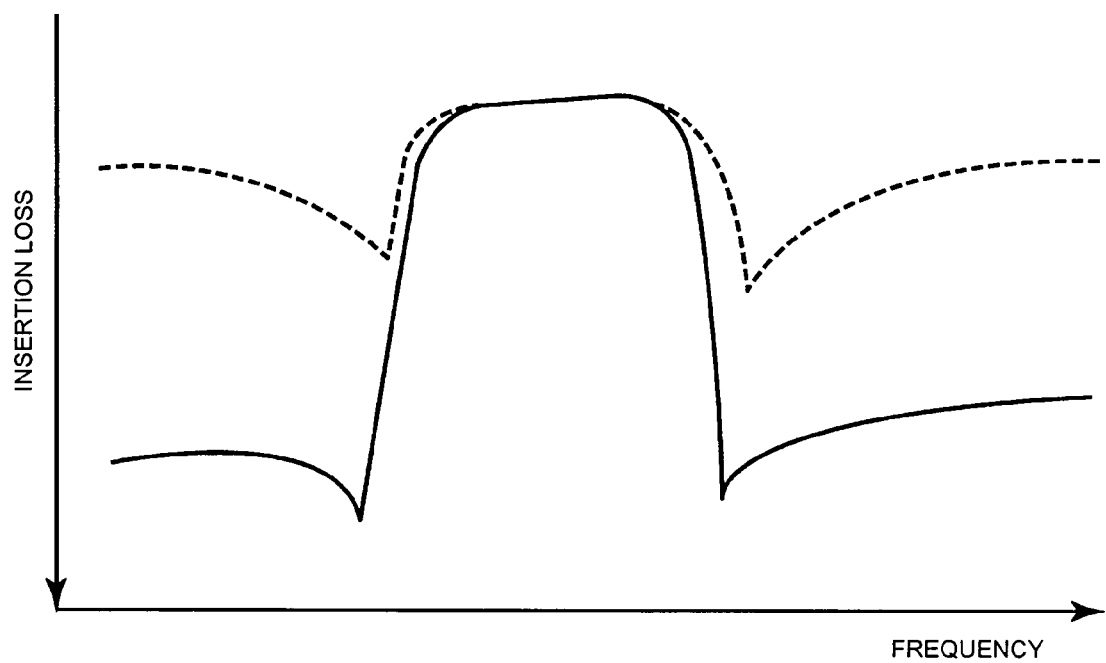
FIG. 10 illustrates attenuation versus frequency characteristics of a filter when direct-path electromagnetic wave is weak and strong between an input IDT and an output IDT.

FIG. 10 illustrates attenuation versus frequency characteristics of a band pass filter defined by the boundary acoustic wave device. When the direct-path electromagnetic wave signal is strong, the attenuation versus frequency characteristics are plotted as represented by the broken line. In the fifth preferred embodiment, the conductive layer 56d, interposed between the boundary acoustic wave elements, controls the direct-path propagating electromagnetic wave. As represented by the solid line in FIG. 10, the out-of-band attenuation is increased. The conductive layers 56d and 57 are preferably made of an appropriate metal such as aluminum.

Figure 9:
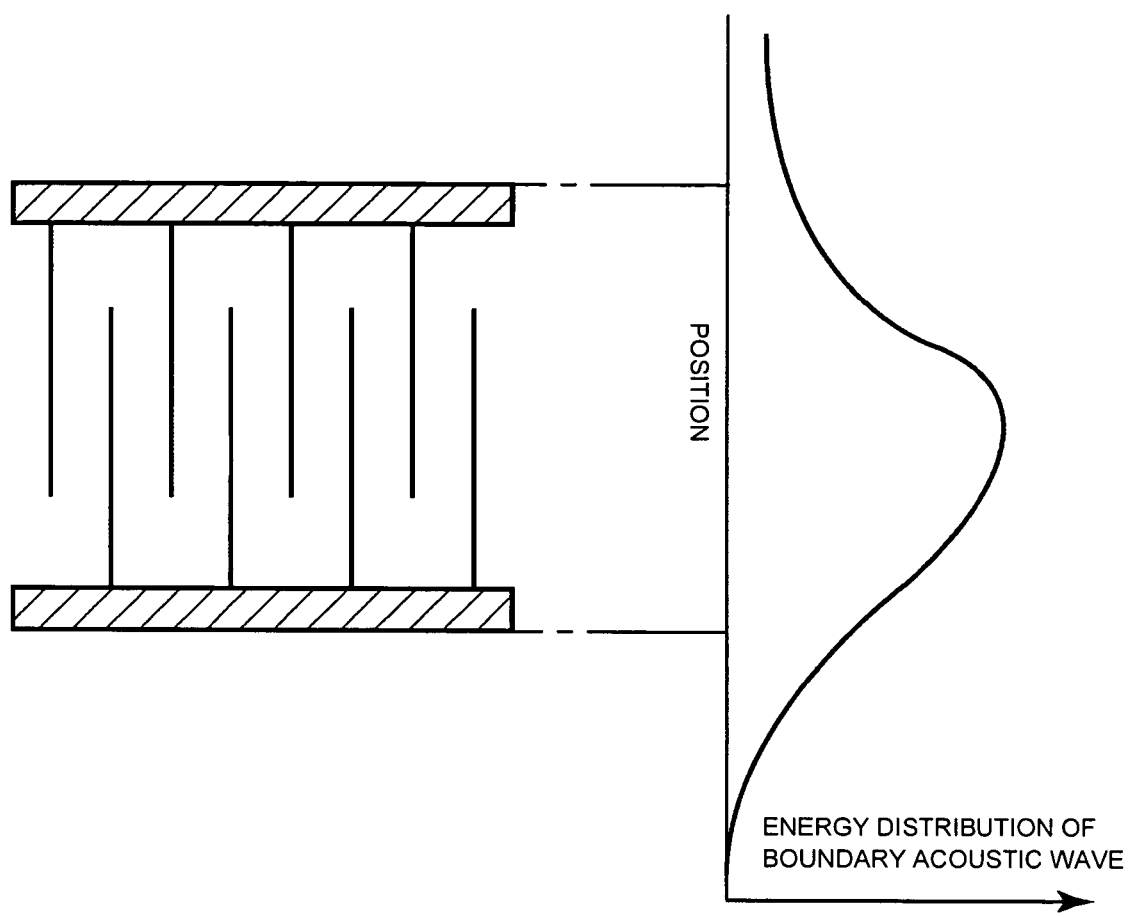
FIG. 9 is a diagram illustrating the distribution of energy of boundary acoustic wave propagating in the boundary acoustic wave element.

The electrical interconnection of the boundary acoustic wave elements 52–57, schematically shown in FIG. 7A, is achieved via through-hole electrodes. If the boundary acoustic wave travels along the boundary between the first and second solid layers of the boundary acoustic wave element, the boundary acoustic wave travels not only in the region of the IDT, but also travels and leaks outwardly from the IDT in a direction that is substantially perpendicular to the surface acoustic wave propagation direction as shown in FIG. 9.

A through-hole electrode is an electrode that is disposed in a through hole provided in a solid layer, in this case, the through-hole electrode may include at least three configurations. First, the electrode may be disposed on the surface of the through hole and the hole may have a cavity. Second, the electrode may be filled in the through hole and there is no cavity, and third the electrode may be disposed on the surface of the through hole and an elastic material may be filled in the cavity of the through hole with the electrode provided on the surface thereof. The elastic material may be made of a conductive material, a resin material, or a glass material. Further, the electrode and the elastic material may be made of same conductive material. If a through-hole electrode has a cavity, a difference between the acoustic impedance of the through-hole electrode and the acoustic impedance of the first and second solid layers increases, and the boundary acoustic wave may be reflected, scattered, or resonated. As a result, unwanted spurious waves and ripples may be included in the characteristics, and the attenuation may be reduced.

Preferably, the through-hole is filled with an elastic material so as not to cause a void after the through-hole electrode is produced by disposing a conductive film in a through hole. With the through-hole electrode filled with the elastic material, the acoustic impedance difference between the through-hole electrode and the first and second solid layers is greatly reduced.

The IDTs are preferably formed by using a photolithographic technique. If the through-hole electrode remains hollow, a problem may arise in the application of a resist and the vacuum chucking process of a wafer. By filling the through-hole electrode with the elastic material, such problems are prevented.

If a conductor, such as copper, is used as an elastic material, wiring resistance of the through-hole electrode is decreased.

If the through-hole portion of the through-hole electrode is not filled with the elastic material, gas tends to enter the central portion of the boundary acoustic wave element from the outside. If a corrosive gas ingresses, performance may be degraded.

Even if the cavity inside the through-hole electrode is filled with the elastic material, the solid layers of the boundary acoustic wave element have a different thermal expansion coefficient from the elastic material. Stress occurs in the device, thereby leading to a crack. There is a possibility that a corrosive gas enters from the outside. If some of the solid layers of the boundary acoustic wave element are made of a polycrystal, such as silicon dioxide or zinc oxide, a corrosive gas may enter through the crack, thereby corroding the electrodes.

Figure 11:
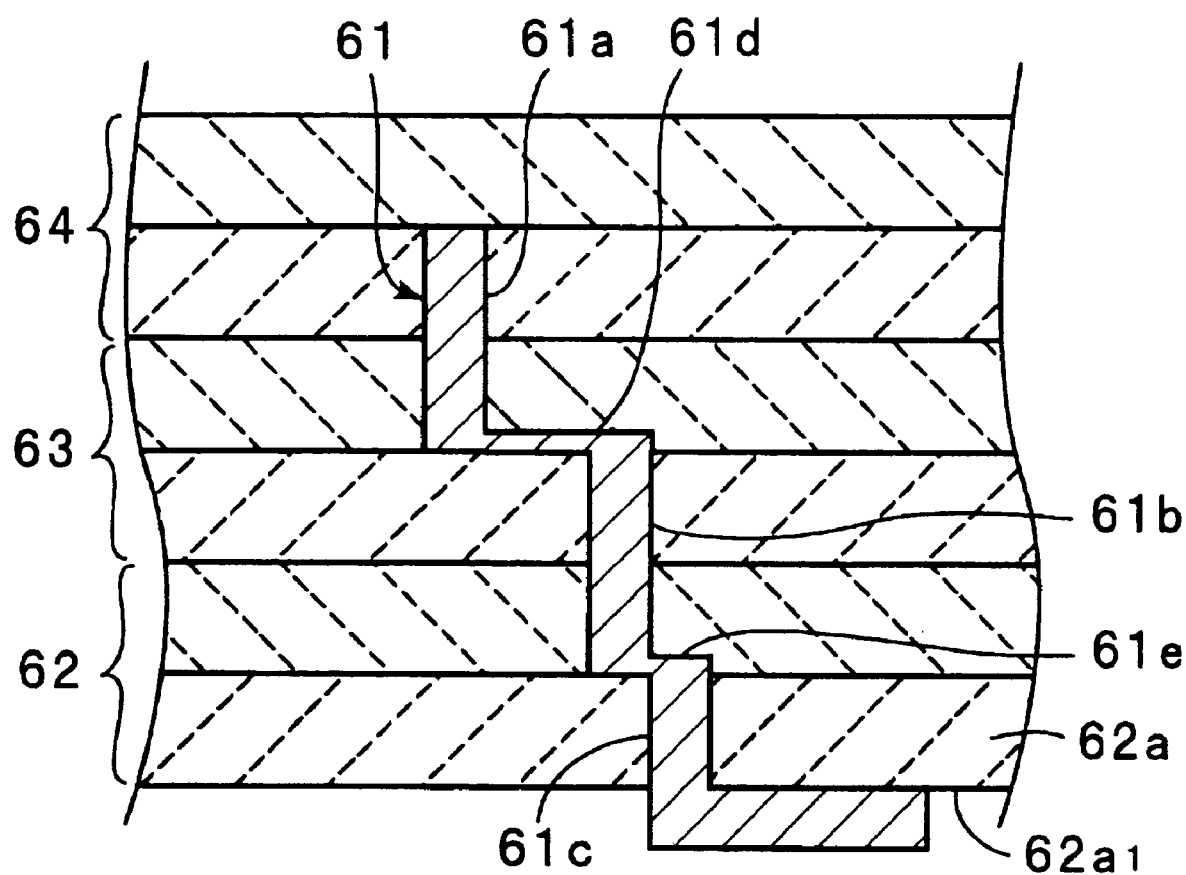
FIG. 11 is a partially broken sectional view illustrating a through-hole electrode provided in the boundary acoustic wave device of preferred embodiments of the present invention.
Figure 12:
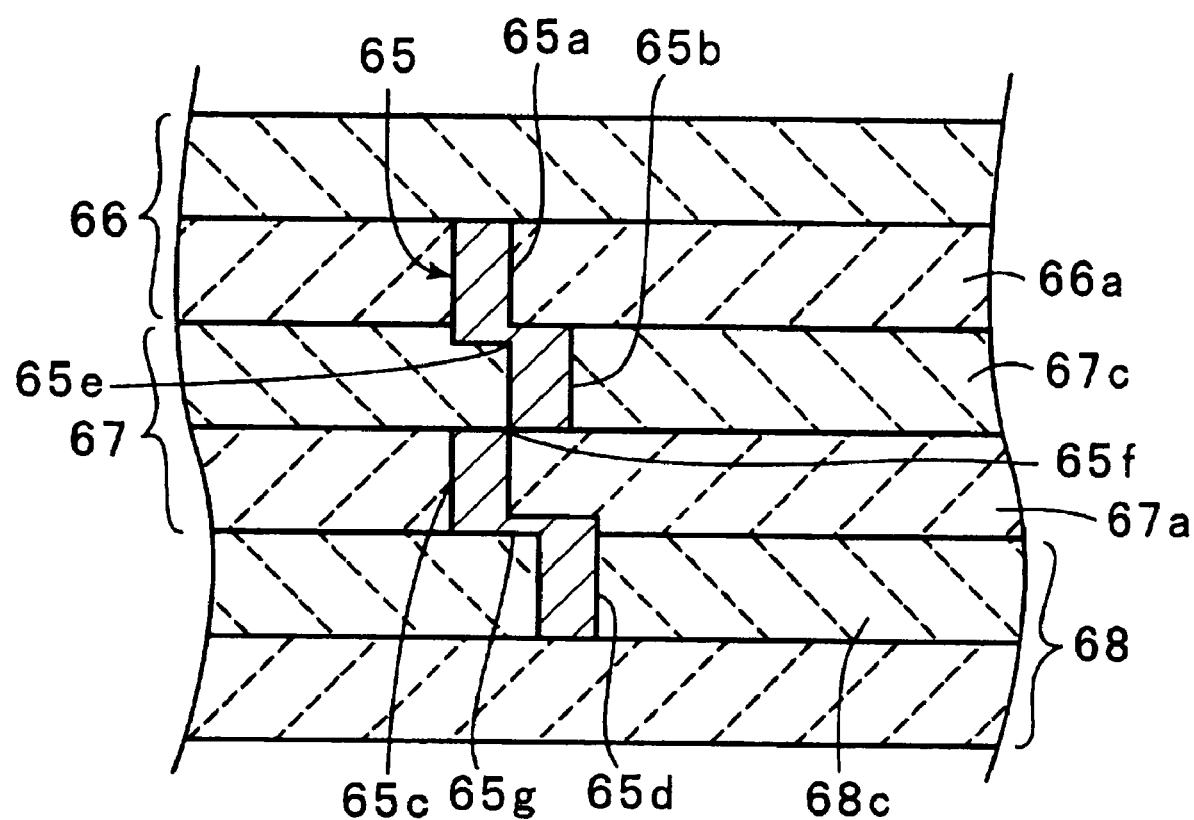
FIG. 12 is a partially broken sectional view illustrating another through-hole electrode provided in the boundary acoustic wave device of preferred embodiments of the present invention.

Through-hole electrodes 61 and 65 shown in FIGS. 11 and 12, respectively, are preferred, if any through-hole is provided. As shown in FIG. 11, the through-hole electrode 61 in a boundary acoustic wave device including boundary acoustic wave elements 62–64 includes a through-hole section 61a that extends from the boundary along which the boundary acoustic wave of the boundary acoustic wave element 64 travels to the boundary along which the boundary acoustic wave element 63 travels, a through-hole section 61b that extends from the boundary along which the boundary acoustic wave of the boundary acoustic wave element 63 travels to the boundary along which the boundary acoustic wave of the boundary acoustic wave element 62 travels, and a through-hole section 61c that extends from the boundary along which the boundary acoustic wave of the boundary acoustic wave element 62 travels to a surface $62a_1$ of the solid layer 62a of the boundary acoustic wave element 62. The through-hole sections 61a–61c are arranged so that they do not overlap in the laminate structure in the direction of thickness thereof. The through-hole section 61a and through-hole section 61b are electrically connected to each other by an interconnect conductor 61d, and the through-hole section 61b and the through-hole section 61c are electrically connected to each other by an interconnect conductor 61e. The interconnect conductors 61d and 61e are provided in the boundary surfaces of the boundary acoustic wave elements 63 and 62, respectively.

In the through-hole electrode 65 shown in FIG. 12, through-hole sections 65a, 65b, 65c, and 65d are connected by interconnect conductors 65e, 65f, and 65g. The through-hole sections 65a, 65b, 65c, and 65d respectively penetrate a first solid layer 66a of a boundary acoustic wave element 66, a second solid layer 67c of a second boundary acoustic wave element 67, a first solid layer 67a of the second boundary acoustic wave element 67, and a second solid layer 68c of a first boundary acoustic wave element 68. In the through-hole electrode 65 shown in FIG. 12 as well, adjacent through-hole sections do not overlap in the direction of lamination.

As shown in FIGS. 11 and 12, the location of upper and lower through-hole sections are shifted and an interconnect conductor provided in a plane at a height substantially in parallel with the boundary acoustic wave propagating surface of the laminate structure connects the upper and the lower through-hole sections. This arrangement controls the ingress of corrosive gas, thereby greatly improving the reliability of the device. In this case, the plane at the height substantially in parallel with the boundary acoustic wave propagating surface may be the boundary acoustic wave propagating surface, a boundary between adjacent boundary acoustic wave elements, or a plane extending at a middle height of one of the first and second solid layers.

In other words, a plurality of through hole electrodes are provided in a plurality of layers of the laminate. Among the layers, the location of the through hole at the upper layer is different from that of the through hole at the lower layer. The upper through hole is connected via a connection electrode to the lower through hole. The connection electrode is arranged on a layer between the upper and lower through holes. The connection electrode is arranged along a surface of the layer.

Figure 13:
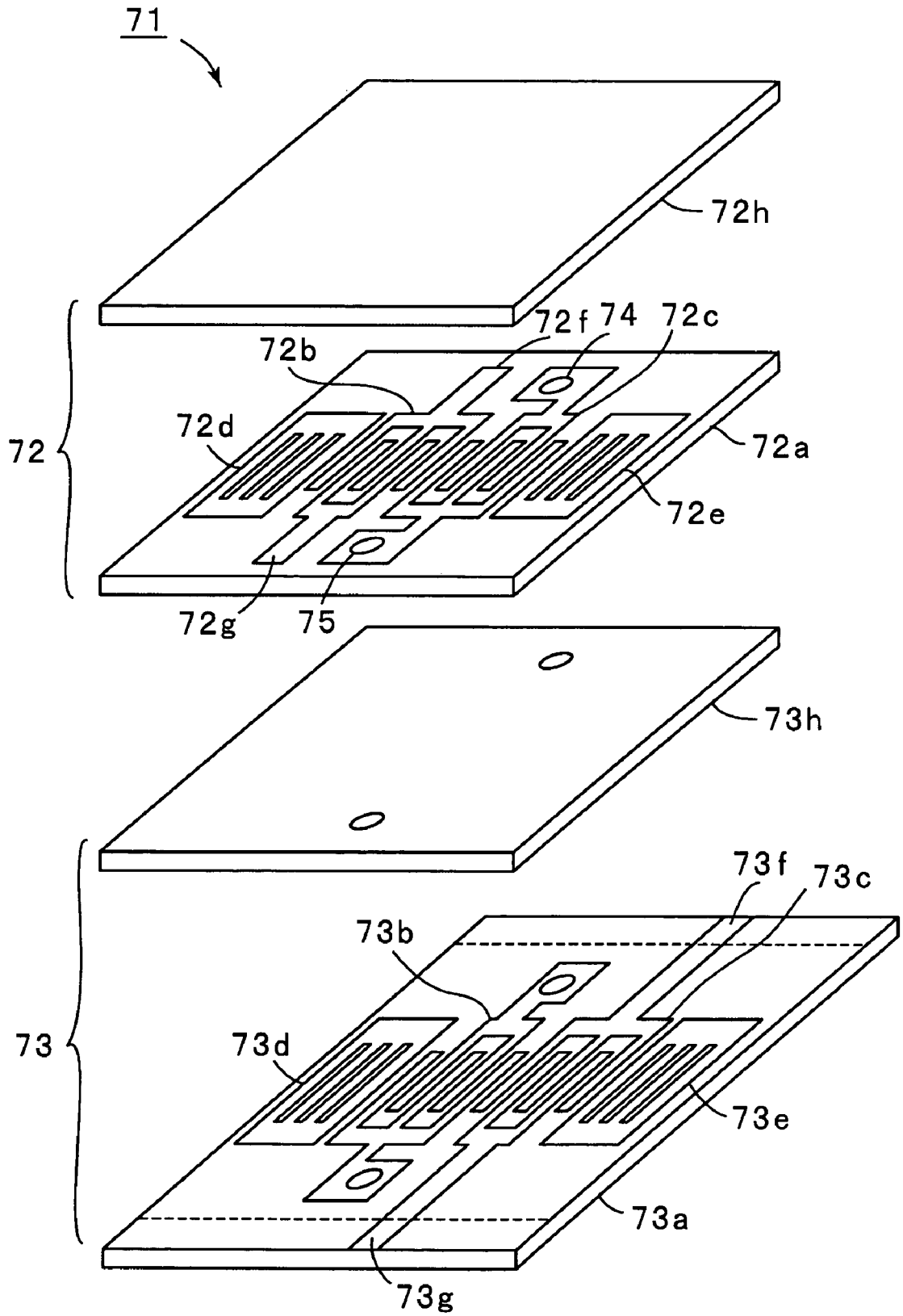
FIG. 13 is an exploded perspective view illustrating a boundary acoustic wave device in accordance with a sixth preferred embodiment of the present invention.
Figure 14:
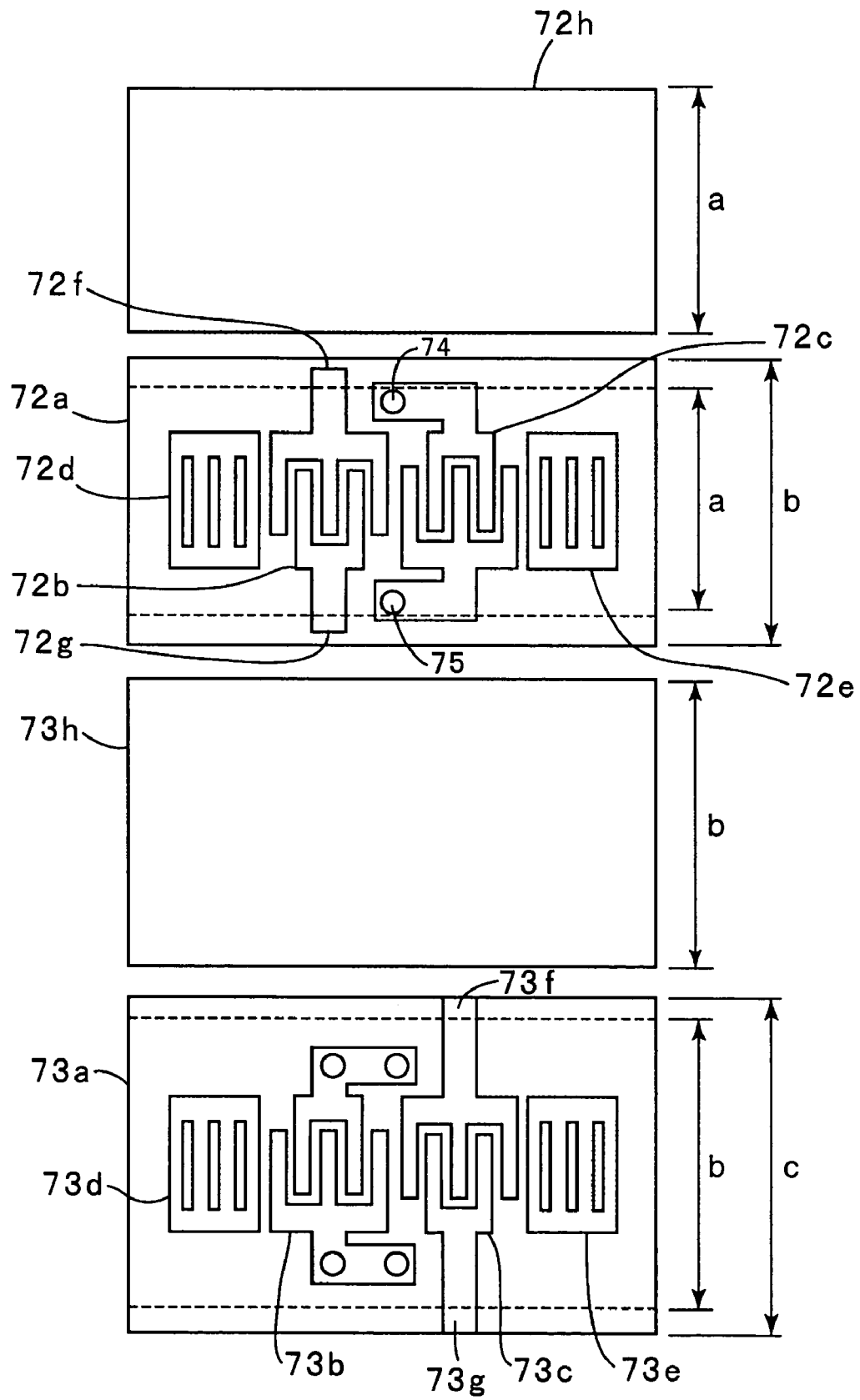
FIG. 14 is a plan view diagrammatically illustrating the layout of electrodes and dimensional relationship of solid layers in the boundary acoustic wave device of the sixth preferred embodiment of the present invention.

FIGS. 13 is an exploded perspective view illustrating a boundary acoustic wave device 71 in accordance with a sixth preferred embodiment of the present invention, and FIG. 14 is a plan view diagrammatically illustrating the layout of electrodes in the boundary acoustic wave device 71.

As shown in FIG. 13, the boundary acoustic wave device 71 includes first and second boundary acoustic wave elements 72 and 73. The first boundary acoustic wave element 72 includes a first solid layer 72a. Disposed on the first solid layer 72a are IDTs 72b and 72c, reflectors 72d and 72e arranged on both sides of the IDTs 72b and 72c, and input electrode pads 72f and 72g. The boundary acoustic wave element 72 is preferably formed by laminating a second solid layer 72h on the first solid layer 72a.

Similarly, IDTs 73b and 73c and reflectors 73d and 73e are disposed on a first solid layer 73a in the second boundary acoustic wave element 73. Input electrode pads 73f and 73g are further disposed on the first solid layer 73a. A second solid layer 73h is laminated on the first solid layer 73a.

The first and second boundary acoustic wave elements 72 and 73 respectively form longitudinally coupled boundary acoustic wave filters.

Through-hole electrodes 74 and 75 are connected to the IDT 72c. The through-hole electrodes 74 and 75 penetrate the first solid layer 72a and the second solid layer 73h and electrically connect the IDT 72c and the IDT 73b. In the boundary acoustic wave device 71, two stages of the longitudinally coupled boundary acoustic wave filters are thus cascaded. By cascading the two stages of the longitudinally coupled boundary acoustic filters, the two-stage cascaded boundary acoustic wave device has a greatly reduced area size.

As clearly seen in FIGS. 13 and 14, the size of the first solid layer 73a, the second solid layer 73h, and the second solid layer 72h decreases from bottom to top in a direction that is substantially perpendicular to the boundary acoustic wave propagating direction. More specifically, c represents a width dimension of the first solid layer 73a, b represents a width dimension of the second solid layer 73h, b represents a width dimension of the first solid layer 72a, and a represents a width dimension of the second solid layer 72h, and a relationship of c>b>a is maintained as shown in FIG. 14.

In the boundary acoustic wave device 71, the input electrode pads 72f and 72g, and output electrode pads 73f and 73g, which are outwardly exposed, provide electrical connection to the outside.

The input IDT 72b arranged in the first boundary acoustic wave element and the output IDT 73c arranged in the second boundary acoustic wave element are shifted in location from each other in the direction of lamination in the boundary acoustic wave device 71. This arrangement controls direct-path electromagnetic waves and the leakage of bulk waves.

Electromagnetic waves directly traveling across two IDTs provided in different layers depends on a (direct-path) capacitance caused between the two IDTs. The direct-path capacitance is proportional to an area of overlap of the two IDTs. The direct-path capacitance is controlled in proportion to the area of overlap by reducing the area of overlap.

As shown in FIGS. 13 and 14, any limitation to the area dimensions of the electrodes and the elements eliminates the need to shift the input IDT 72b and the output IDT 73c to a nonoverlapping state in a plan view. For example, if the overlapping area is reduced by 10%, the direct-path capacitance is also reduced by 10%. If the location of the input IDT 72b and the output IDT 73c are shifted with respect to each other, out-of-band attenuation in the filter is improved accordingly, and a 100% nonoverlapping arrangement is not a requirement.

In a structure where at least three boundary acoustic wave elements are laminated, a direct-path capacitance at an intermediate stage is reduced not only by shifting an IDT connected to an input terminal from an IDT connected to an output terminal in position, but also by shifting an IDT arranged at the intermediate stage. In this case, the out-of-band attenuation of the filter is also increased.

If a plurality of IDTs are longitudinally coupled to produce a longitudinally coupled filter or a transversal type filter, IDTs, other than IDTs which are electrically connected through conductive wiring for longitudinal connection, are preferably shifted from each other in the direction of lamination.

Not only the overlapping area of the IDTs, but also the overlapping areas of bus bars and wiring electrodes connected to the IDTs are preferably reduced. The direct-path capacitance is further reduced.

If a reflector, which is electrically unconnected to the IDT, is placed close to an IDT within a range of about 3λ, a direct-path capacitance is created from a path of the IDT provided on one boundary acoustic wave element—the reflector provided on the boundary acoustic wave element—a reflector provided on another boundary acoustic wave element—and an IDT provided on the other boundary acoustic wave element. Thus, the location of the reflector is also preferably shifted. The direct-path capacitance is further reduced, and the out-of-band attenuation is further increased.

If a plurality of boundary acoustic wave element are electrically connected via the though-hole electrodes, the location of the through-hole electrode is flexibly set. The area dimensions of the boundary acoustic wave device are further reduced.

When a monocrystal material is used for the solid layer of the boundary acoustic wave element, formation of the through-hole electrode is difficult. For example, a through-hole may be formed via reactive etching using a gas mixture of Ar and $CF_4$. If the boundary acoustic wave element is thick, assuring vertical stability and integrity of the through-hole becomes difficult, and process time increases. The solid layer with a through-hole drilled therein has a lower mechanical strength. Stress due to a mounting operation of a circuit board and ambient temperature change may lead to cracks.

As already discussed, the boundary acoustic wave may be reflected or scattered by the through-hole electrode, and corrosive gas may ingress into the device.

The plurality of boundary acoustic wave elements that are laminated together may be electrically connected through a wiring electrode that is routed to the external surface of the boundary acoustic wave device rather than by using the through-hole electrode.

Figure 15:
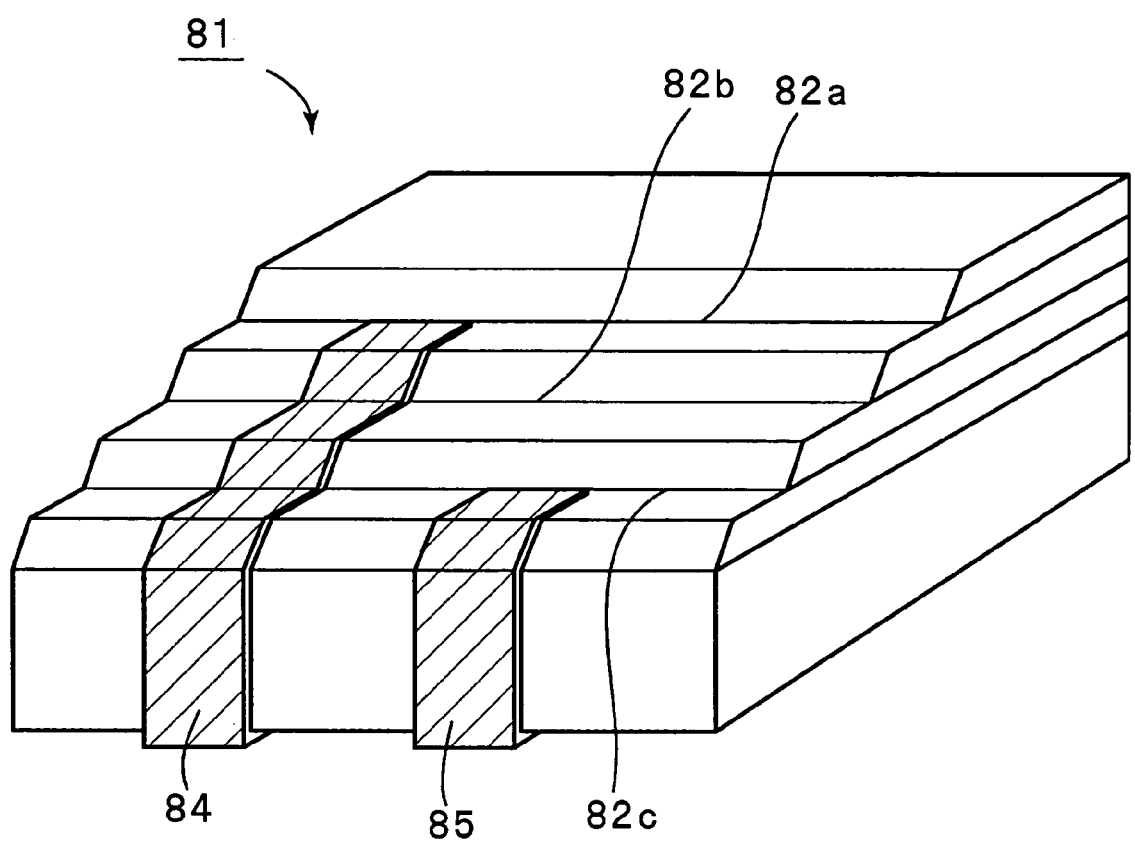
FIG. 15 is a perspective view of a modification of the boundary acoustic wave device of preferred embodiments of the present invention, wherein a step is provided on the external surface of the boundary acoustic wave device.

FIG. 15 is a perspective view illustrating wiring electrodes 84 and 85 mounted on the external surface of such a boundary acoustic wave device 81. The boundary acoustic wave device 81 includes a plurality of steps 83a–82c formed on the external surface thereof. The steps 82a–82c are easily provided by differentiating the two dimensional shape. More specifically, the steps are easily provided by differentiating the width dimension of the solid layer to be laminated or a depth dimension perpendicular to the width of the solid layer as shown in FIG. 13.

The steps 83a–83c are formed in a wafer resulting in several tens to several tens of thousands of boundary acoustic wave elements, and wiring electrodes are then collectively disposed using a photolithographic technique, screen printing, and a plating method. After that, the wafer is diced into individual boundary acoustic wave devices. The wiring electrodes are also diced. In this way, the electrical connection between the boundary acoustic wave elements is achieved in a cost effective manner.

Figure 16:
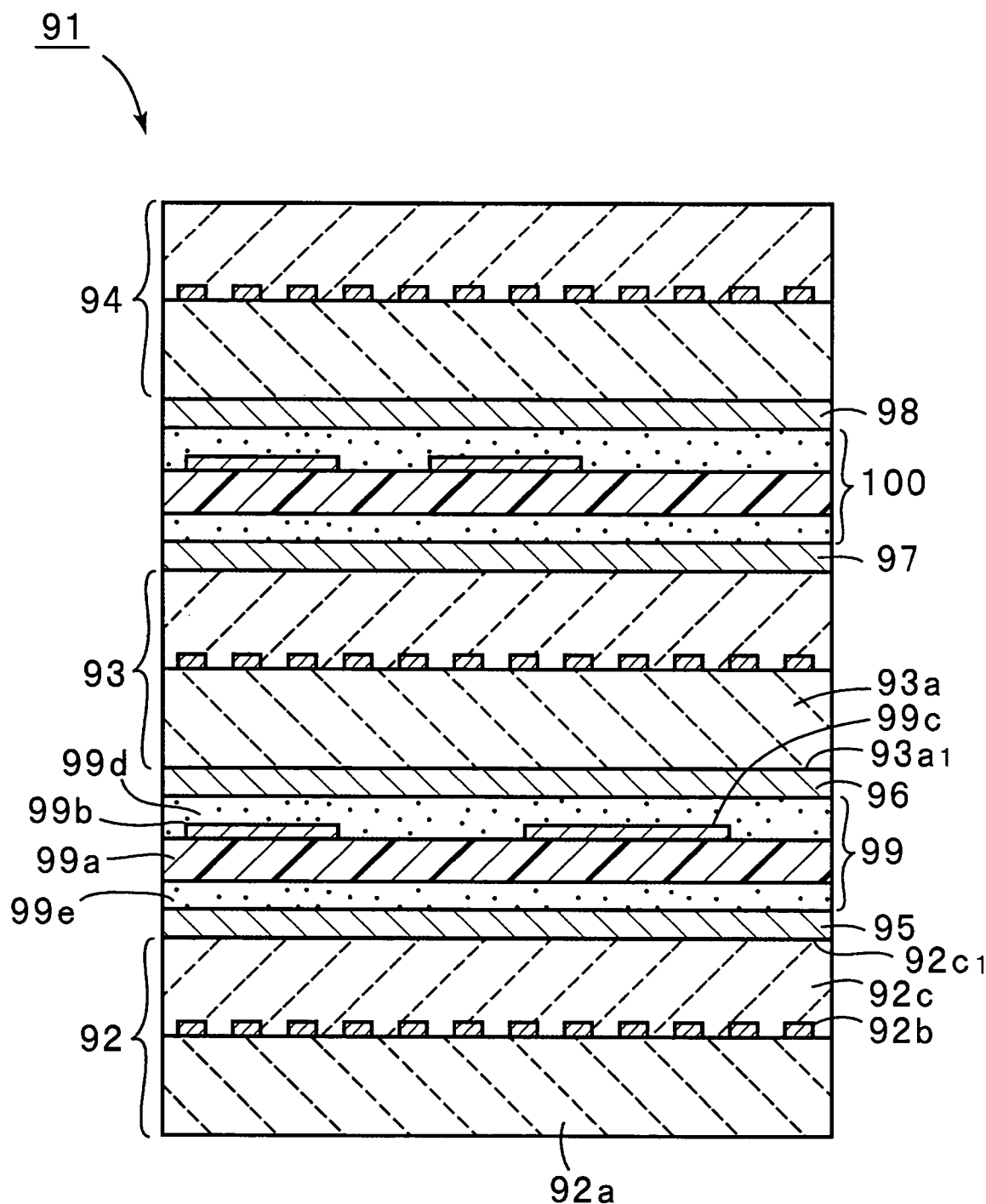
FIG. 16 is a front sectional view illustrating a boundary acoustic wave device in accordance with a seventh preferred embodiment of the present invention.

FIG. 16 is a front sectional view illustrating a boundary acoustic wave device 91 in accordance with a seventh preferred embodiment of the present invention.

The boundary acoustic wave device 91 includes boundary acoustic wave elements 92–94. The boundary acoustic wave element 92 includes a first solid layer 92a preferably made of lithium tantalate, an IDT 92b, and a second solid layer 92c preferably made of silicon dioxide. Each of the boundary acoustic wave element 93 and the boundary acoustic wave element 94 preferably has substantially identical structure to the boundary acoustic wave element 92.

The seventh preferred embodiment of the present invention includes a high thermal-conductivity layer 95, a circuit element layer 99, and a high thermal-conductivity layer 96 interposed between the boundary acoustic wave element 92 and the boundary acoustic wave element 93, and a high thermal-conductivity layer 97, a circuit element layer 100, and a high thermal-conductivity layer 98 interposed between the boundary acoustic wave element 93 and the boundary acoustic wave element 94. More specifically, the circuit element layer 99 is interposed between the boundary acoustic wave element 92 and the boundary acoustic wave element 93. The circuit element layer 99 includes electrodes 99b and 99c disposed on an epoxy substrate 99a that is softer than and has a larger dielectric constant than lithium tantalate. The electrodes 99b and 99c defines an impedance matching circuit, for example. The shape and number of the electrodes 99b and 99c are determined depending on functions of the device.

Epoxy bonding agent layers 99d and 99e, disposed above and below, cover the epoxy substrate 99a and the electrodes 99b and 99c in the circuit element layer 99. The circuit element layer 99 is bonded to the high thermal-conductivity layers 95 and 96 using the epoxy bonding agent layers 99d and 99e. The high thermal-conductivity layers 95 and 96 respectively cover a surface $92c_1$ of the second solid layer 92c of the first boundary acoustic wave element 92 and a surface $93a_1$ of the first solid layer 93a of the second boundary acoustic wave element 93.

The circuit element layer 100 and the high thermal-conductivity layers 97 and 98 are also provided between the boundary acoustic wave element 93 and the boundary acoustic wave element 94.

The high thermal-conductivity layers 95 and 96 are preferably made of carbon film. The material of the high thermal-conductivity layers 95 and 96 is not limited to any particular material. Any material is acceptable as the material for the high thermal-conductivity layers 95 and 96 as long as the material has a thermal conductivity greater than that of the material of the first and second solid layers of the boundary acoustic wave element in contact therewith. With the high thermal-conductivity layers 95 and 96 being provided, heat dissipation performance of the boundary acoustic wave device 91 is greatly improved. This arrangement controls degradation due to direct-path waves when high power is applied.

Variations in frequency and temperature characteristics of a solid layer through which the boundary acoustic wave propagates are determined by a variation in acoustic wave speed responsive to unit temperature change, and a variation in the length of the substrate along the wave propagation direction responsive to unit temperature change. Variations in frequency and temperature characteristics are reduced if the contraction and expansion of the substrate with temperature are controlled. The linear expansion coefficient of the carbon film defining the high thermal-conductivity layers 95–98 is less than the linear expansion coefficient of the solid layers of the boundary acoustic wave elements 92–94. The carbon film restricts the thermal expansion of the boundary acoustic wave elements 92–94 in the horizontal direction. This arrangement controls breakdown of the boundary acoustic wave device 91 due to stress arising from a thermal expansion coefficient difference if the boundary acoustic wave device 91 is mounted on a hard ceramic substrate having a small thermal expansion coefficient. In preferred embodiments of the present invention, a low linear thermal expansion coefficient layer that is less than the solid layer of the boundary acoustic wave element in linear thermal expansion coefficient, such as the carbon thin film, may be provided. In the seventh preferred embodiment, the carbon thin film functions as both the high thermal conductivity layer and the low linear thermal expansion coefficient layer. Alternatively, a material layer providing only one of the two functions may be provided.

A linear thermal expansion coefficient layer having a polarity that is opposite to the linear thermal expansion coefficient of the solid layer of the boundary acoustic wave element may be provided instead of the low linear thermal expansion coefficient layer.

With the circuit element layers 99 and 100 interposed, the boundary acoustic wave device 91 includes an appropriate circuit such as an impedance matching circuit.

Any appropriate electrode may be provided as the electrodes 99b and 99c depending on a desired function. For example, a circuit element to be incorporated may be a capacitance element, a strip line, a micro strip filter including a stub and a strip line, or a mixer. A resistor element may be included using a resistance material instead of the electrode. The circuit element provided on the circuit element layers 99 and 100 is not limited to any particular element.

If an impedance matching circuit or a modulator circuit of the boundary acoustic wave element is provided using the circuit element layers 99 and 100, a corresponding external circuit may be omitted.

To perform wire bonding or bump bonding on the external surface of the boundary acoustic wave device 91, an electrical interconnect line that has a length as long as several tens to several thousands μm is provided. The characteristic impedance of such a line is typically different from the input and output impedance of a boundary acoustic wave filter. This can increase reflection loss due to impedance mismatching of the line. If the circuit element layers 99 and 100 are incorporated, no long line is required, and the reflection loss is greatly reduced. In a frequency range above 1 GHz, in particular, shortening of the line substantially improves the characteristics.

In the seventh preferred embodiment, the epoxy substrate 99a is covered with the epoxy bonding agent layers 99d and 99e, which are soft dielectric layers. Thus, direct-path bulk waves leaked from between boundary acoustic wave elements are absorbed.

Figure 17:
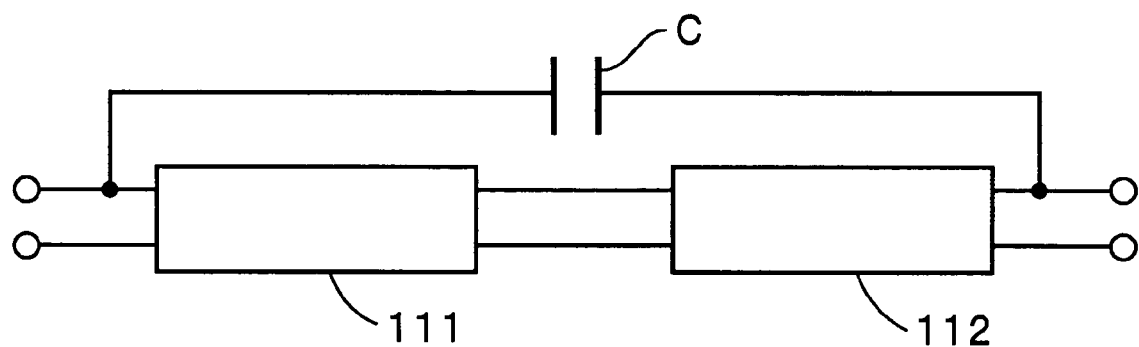
FIG. 17 is a circuit diagram illustrating a direct-path capacitance of a boundary acoustic wave filter having two stages.
Figure 18:
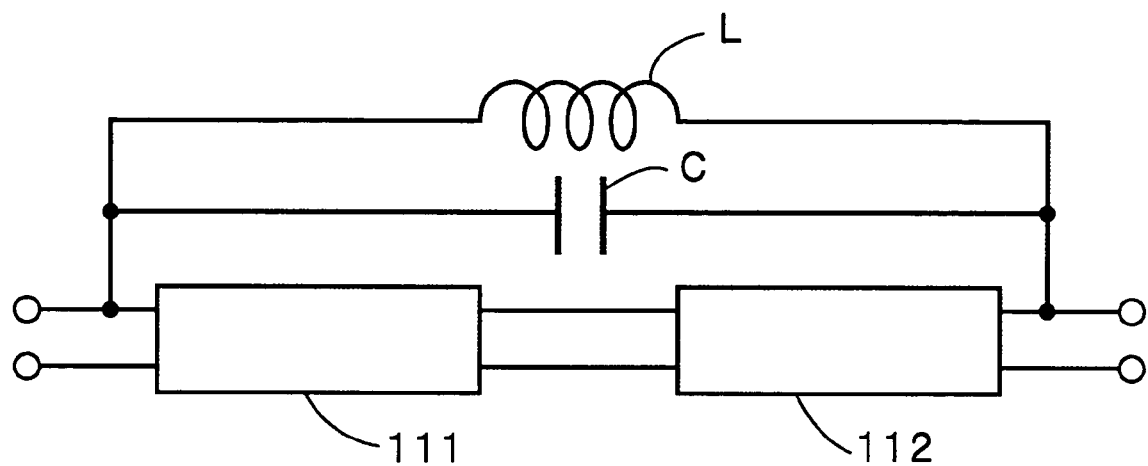
FIG. 18 is a circuit diagram illustrating the filter in which an inductor is connected in parallel with the direct-path capacitance.

The direct-path capacitance is reduced by reducing the overlapping area between the input IDT and the output IDT in the sixth preferred embodiment. If a plurality of boundary acoustic wave elements are laminated at intervals of about 10λ, such an arrangement may not be sufficient. If a piezoelectric substrate having a large electromagnetic factor is used for the first solid layer, a direct-path capacitance is produced between the boundary acoustic wave elements because of the large dielectric constant thereof. Sometimes, a direct-path capacitance greater than about 10 pF may occur. Thus, configurations other than restricting the direct-path capacitance by reducing the overlapping area of the IDTs are preferred. FIG. 17 diagrammatically illustrates a direct-path capacitance C that occurs between an input terminal and an output terminal with longitudinally coupled boundary acoustic wave filters 111 and 112 cascaded. Let f0 represent a center frequency of the boundary acoustic wave filter, and a parallel circuit of the direct-patch capacitance C and an inductor L is set in an anti-resonance state at the center frequency f0 if the direct-path capacitance C and the inductor L having an inductance of $\{(2 \times \pi \times f0)^2 \times C\}^{-1}$ are connected as shown in FIG. 18. Thus, no degradation in performance is caused by the direct-path capacitance.

If the parallel inductor L is merely connected as discussed above, improvements in the characteristics are limited to a region at and around the center frequency f0. Preferably, a micro strip line filter or an LC filter, having a wide bandpass characteristic, is disposed in each of the circuit element layers 99 and 100 shown in FIG. 16. This arrangement provides wide band and increased attenuation filter characteristics.

Figure 19:
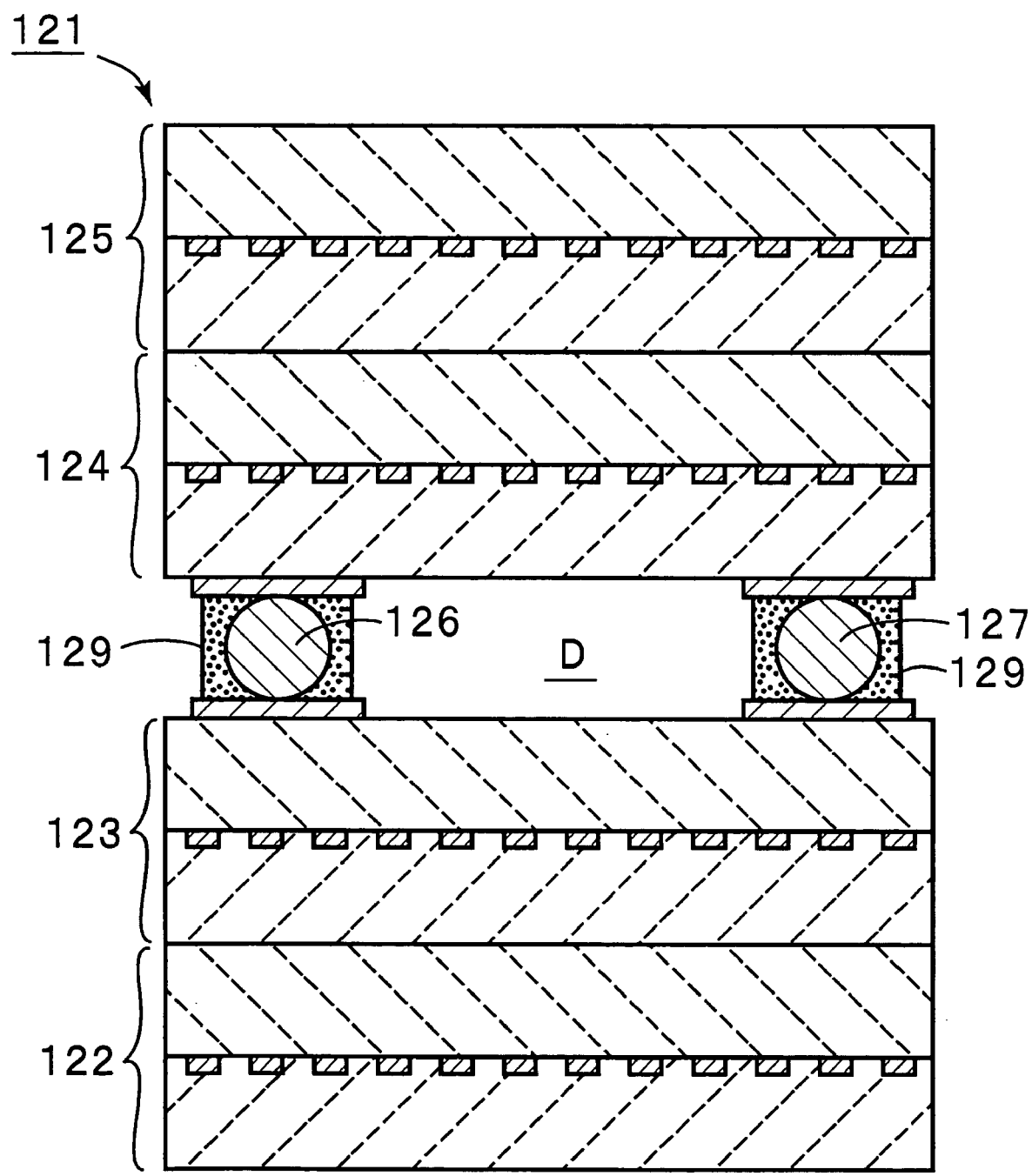
FIG. 19 is a front sectional view illustrating a boundary acoustic wave device in accordance with an eighth preferred embodiment of the present invention.

FIG. 19 is a front sectional view illustrating a boundary acoustic wave device 121 in accordance with an eighth preferred embodiment of the present invention. The boundary acoustic wave device 121 includes a laminate of boundary acoustic wave elements 122, 123, 124, and 125. The eighth preferred embodiment is different from the first preferred embodiment in that a cavity D is provided between the boundary acoustic wave elements 123 and 124. The boundary acoustic wave element 123 is electrically connected to the boundary acoustic wave element 124 via metal bumps 126 and 127. The height of the cavity D is defined by a height dimension of the metal bumps 126 and 127. Element 129 is an epoxy resin.

It is not a requirement that the boundary acoustic wave elements be closely in contact with each other. With the cavity D, the boundary acoustic wave elements may be laminated. In this arrangement, thermal source is distributed in the boundary acoustic wave device 121, and a temperature increase in the entire boundary acoustic wave device 121 is controlled.

The boundary acoustic wave device of preferred embodiments of the present invention has a laminate structure in which a plurality of boundary acoustic wave elements are laminated. The boundary acoustic wave does not propagate along the surface of each boundary acoustic wave element. Thus, a package structure having a cavity is not required. In addition, it is not necessary to encapsulate the boundary acoustic wave device in a package.

If the boundary acoustic wave device is used only for a short period of time, the addition of a housing or a package to the device is not required.

If the boundary acoustic wave device is intended for use for a long period of time, the boundary acoustic wave device is subject to a breakdown due to a corrosion of the solid layer defining the boundary acoustic wave element, corrosion of the electrode caused by a corrosive gas ingressing into the solid layer, and stress generated due to a difference in thermal expansion coefficient between the circuit board and the boundary acoustic wave device in the course of repeated ambient temperature cycles. The use of the housing is preferred to enhance the reliability of the device for use for a long period of time.

The formation of a cavity as in the boundary acoustic wave device or a monolithic filter is not required. This is because the energy of boundary acoustic waves reaching the chip surface is extremely small.

Figure 20:
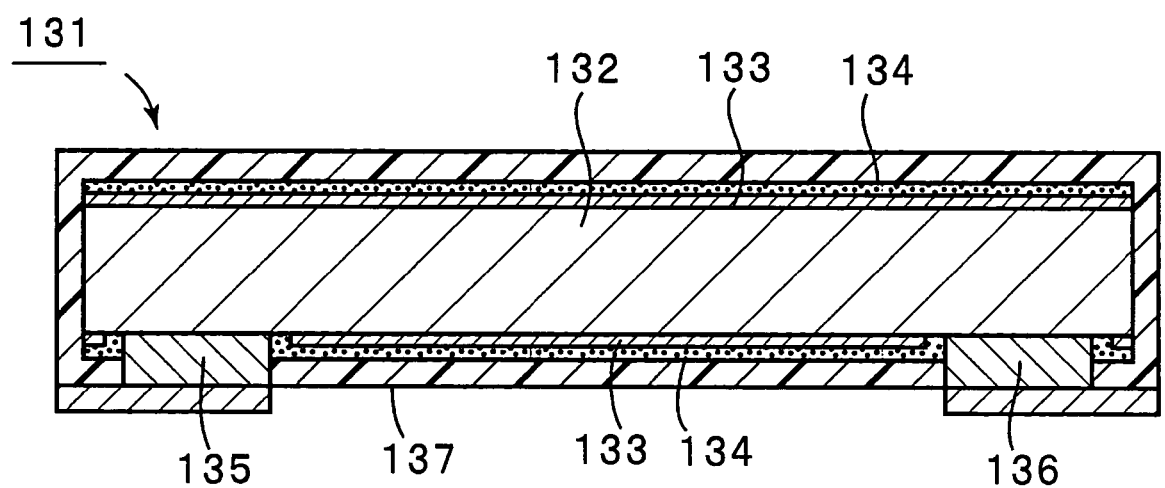
FIG. 20 is a front sectional view illustrating another modification of the boundary acoustic wave device of preferred embodiments of the present invention.
Figure 21:
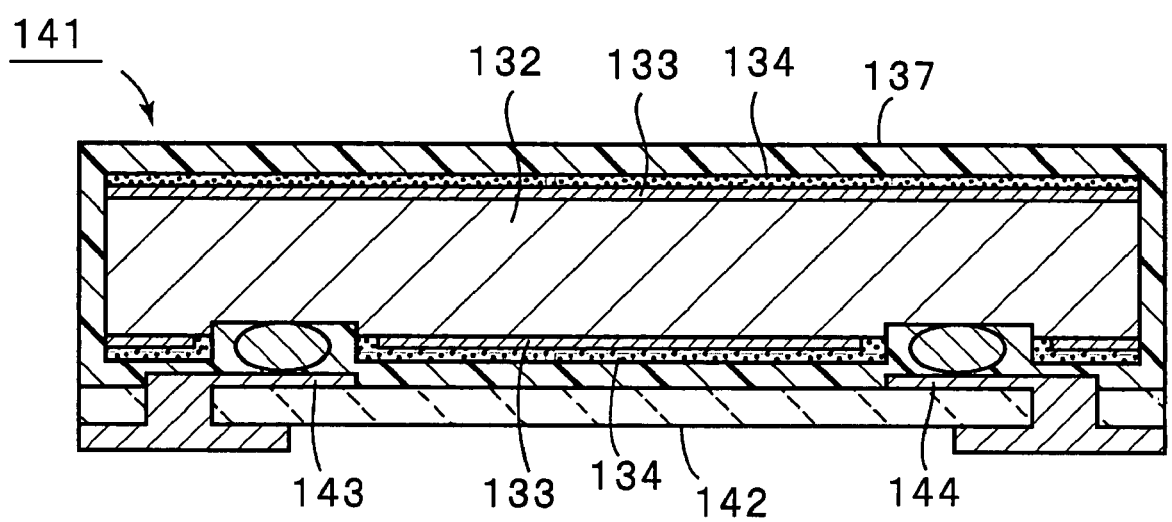
FIG. 21 is a front sectional view illustrating yet another modification of the boundary acoustic wave device of preferred embodiments of the present invention.
Figure 22:
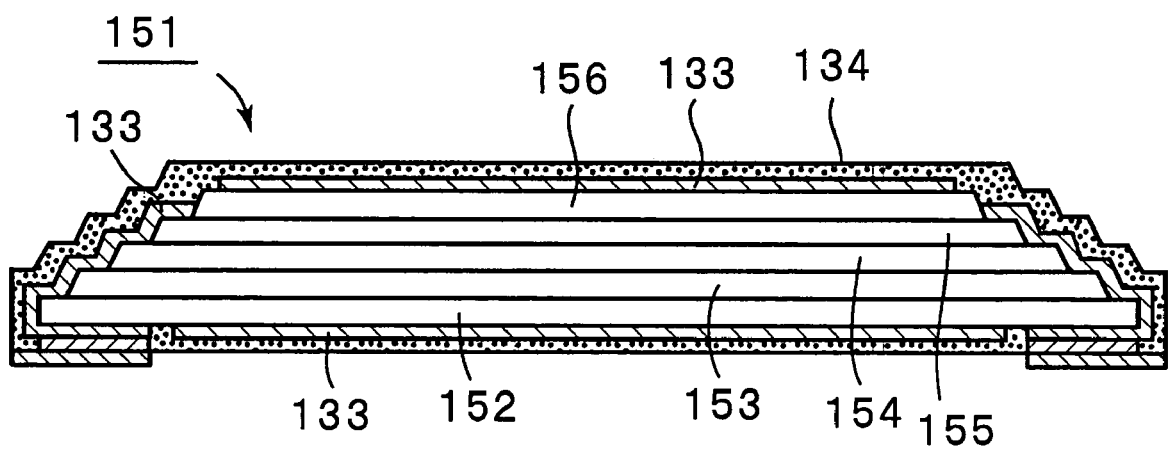
FIG. 22 is a front sectional view illustrating a further modification of the boundary acoustic wave device of preferred embodiments of the present invention.
Figure 23:
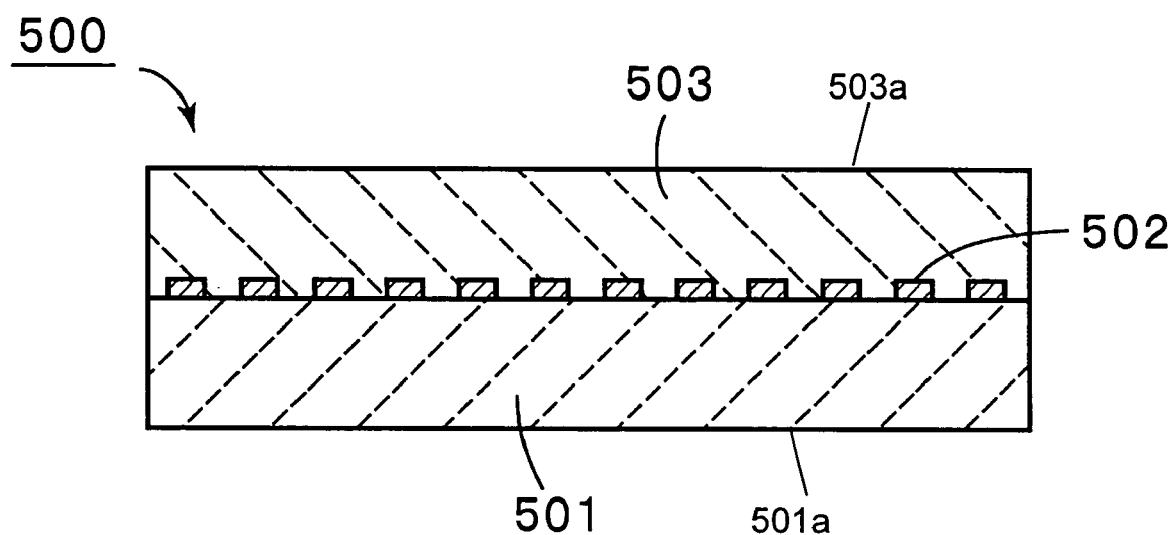
FIG. 23 is a front sectional view illustrating a known boundary acoustic wave device.
Figure 24:
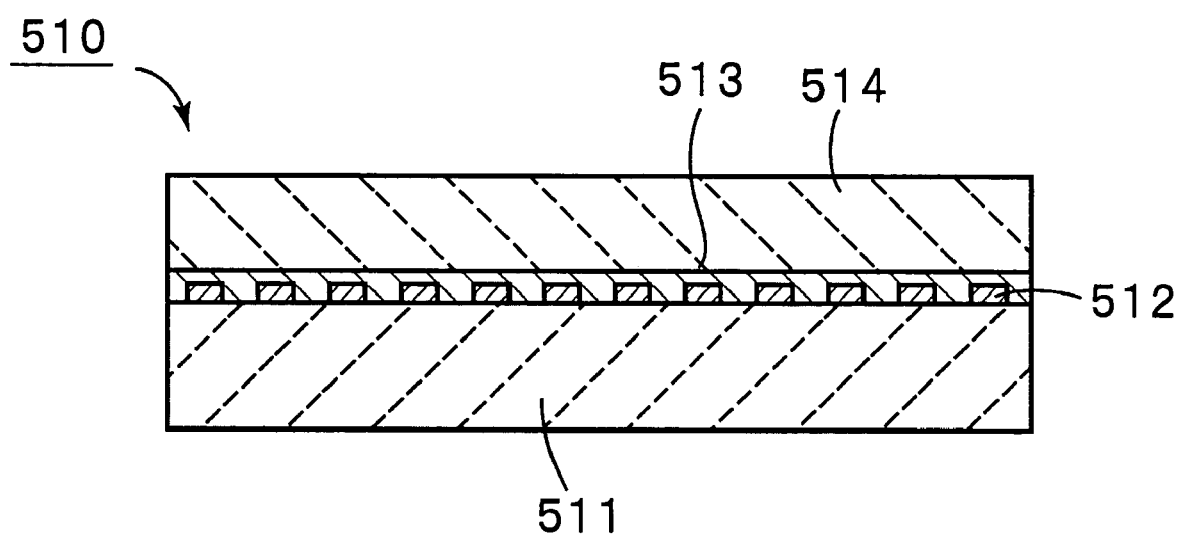
FIG. 24 is a front sectional view illustrating another known boundary acoustic wave device.

FIGS. 20 through 22 are front sectional views illustrating modifications of the boundary acoustic wave device of preferred embodiments of the present invention.

A boundary acoustic wave device 131 shown in FIG. 20 includes an electrically conductive layer 133 and an insulating layer 134 disposed on the surface of a boundary acoustic wave device chip 132. The conductive layer 133 may be a laminated metal layer made of a gold film and a nickel film laminated in that order, or a single metal film. The use of the conductive layer 133 electromagnetically shields the boundary acoustic wave device chip 132. The insulating layer 134 made of an insulating material, such as aluminum oxide ($Al_2O_3$) or aluminum nitride (AlN), protects the boundary acoustic wave device chip 132. The boundary acoustic wave device chip 132 is entirely covered with an encapsulation resin layer 137 except for the connection electrode pads 135 and 136. The use of the encapsulation resin layer 137 reliably keeps out corrosive gases.

The boundary acoustic wave device chip 132 is shown as having a single layer. As already discussed in connection with preferred embodiments described above, in practice, the boundary acoustic wave device chip includes a plurality of boundary acoustic wave elements.

A boundary acoustic wave device 141 shown in FIG. 21 includes an electrically conductive layer 133, an insulating layer 134, and an encapsulation resin layer 137 in the boundary acoustic wave device chip thereof as in the boundary acoustic wave device 131. The boundary acoustic wave device 141 is different from the boundary acoustic wave device 131 in that the boundary acoustic wave device chip 132 is bonded onto electrode pads 143 and 144 mounted on a hard ceramic substrate 142 via ultrasonic welding. After being bonded, the boundary acoustic wave device chip 132 is covered with an encapsulation resin layer 137. The boundary acoustic wave device chip 132 is rigidly secured to the substrate 142. If the boundary acoustic wave device 141 is mounted on a printed circuit board, stress acting on the boundary acoustic wave device chip 132 from the printed circuit board is reduced by the ceramic substrate 142. In other words, the ceramic substrate 142 functions as a stress relaxation layer.

A boundary acoustic wave device 151 shown in FIG. 22 includes a laminate of a plurality of boundary acoustic wave elements 152–156. The two dimensional shapes of the boundary acoustic wave elements 152–156 are different from each other. Steps are produced on the external surface as shown, and a conductive layer 133 is arranged on the steps. The conductive layer 133 on the steps electrically connects the boundary acoustic wave elements 152–156. The conductive layer 133 is provided using a conductive paste. The flexibility of the conductive paste alleviates stress acting on the boundary acoustic wave device 151 when being mounted on the printed circuit board. The external conductive layer, made of the flexible conductive paste, functions as a stress relaxation layer.

Since the boundary acoustic wave device of the preferred embodiments of the present invention includes the laminate of the plurality of boundary acoustic wave elements, the two dimensional area size of the device is less than the known boundary acoustic wave device. Thus, the boundary acoustic wave device for use in a band pass filter or a resonator is further miniaturized.

Since the boundary acoustic wave device uses the boundary acoustic wave, a package having a cavity, which is expensive to produce, in not required. Thus, the cost of the band pass filter or the resonator is greatly reduced, and the manufacturing process of the band pass filter or the resonator is greatly simplified.

The boundary acoustic wave device of the preferred embodiments of the present invention includes the first solid layer made of the piezoelectric material, the second solid layer laminated on the first solid layer and made of one of the piezoelectric material and the insulating material, the boundary acoustic wave exciting IDT arranged in the boundary between the first and second solid layers, and the surface acoustic wave exciting IDT arranged on the surface of the first solid layer. The boundary acoustic wave element and the surface acoustic wave element are combined into a unitary body. A miniaturized boundary acoustic wave device including the boundary acoustic wave element and the surface acoustic wave element combined in the unitary body is provided.

A miniaturized band pass filter and resonator for use in a high frequency region above 1 GHz are thus provided.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A boundary acoustic wave device comprising:
   a laminate including a plurality of boundary acoustic wave elements; wherein
   each of the plurality of boundary acoustic wave elements includes a first solid layer made of a piezoelectric material, a second solid layer disposed on the first solid layer and made of one of a piezoelectric material and an insulating material, and a boundary acoustic wave exciting interdigital transducer disposed in a boundary between the first and second solid layers.

2. A boundary acoustic wave device according to claim 1, further comprising a surface acoustic wave element disposed on an external surface of the laminate, wherein the surface acoustic wave element includes a piezoelectric body and a surface acoustic wave exciting interdigital transducer disposed on one surface of the piezoelectric body.

3. A boundary acoustic wave device according to claim 2, wherein a boundary between the solid layers, other than the boundary having the boundary acoustic wave exciting interdigital transducer, is not flatter than the surface having the surface acoustic wave exciting interdigital transducer.

4. A boundary acoustic wave device according to claim 1, further comprising an acoustic wave absorbing layer disposed at at least one of an external surface of the laminate, a boundary between adjacent boundary acoustic wave elements, and a location between one of the boundary acoustic wave elements and the external surface of the laminate.

5. A boundary acoustic wave device according to claim 1, further comprising a third solid layer having a different acoustic impedance from that of the first and second solid layers and disposed at at least one of an external surface of the laminate, a boundary between adjacent boundary acoustic wave elements, and a location between one of the boundary acoustic wave elements and the external surface of the laminate.

6. A boundary acoustic wave device according to claim 1, further comprising an electrically conductive layer disposed at at least one of an external surface of the laminate, a boundary between adjacent boundary acoustic wave elements, and a location between one of the boundary acoustic wave elements and the external surface of the laminate.

7. A boundary acoustic wave device according to claim 1, wherein a location of the boundary acoustic wave exciting interdigital transducer disposed on one boundary acoustic wave element is shifted in a laminating direction from a location of the boundary acoustic wave exciting interdigital transducer disposed on another boundary acoustic wave element.

8. A boundary acoustic wave device according to claim 1, further comprising an inductance element connected between the boundary acoustic wave exciting interdigital transducers of different boundary acoustic wave elements.

9. A boundary acoustic wave device according to claim 1, further comprising at least two boundary acoustic wave elements electrically connected to each other via a through-hole electrode provided in the laminate, wherein an elastic material is provided inside the through-hole electrode.

10. A boundary acoustic wave device according to claim 1, further comprising:
    at least two boundary acoustic wave elements electrically connected to each other via a through-hole electrode arranged in the laminate; wherein
    the through-hole electrode includes a plurality of through-hole electrode sections including upper and lower through-hole electrode sections arranged at different locations in a plane at a height within the laminate, and the two through-hole electrode sections are electrically connected to each other through an electrical connection junction extending in the plane.

11. A boundary acoustic wave device according to claim 1, wherein at least two boundary acoustic wave elements are electrically connected to each other via a wiring electrode arranged on an external surface of the laminate.

12. A boundary acoustic wave device according to claim 11, wherein a step is provided on the external surface of the laminate, and the wiring electrode is arranged on the step.

13. A boundary acoustic wave device according to claim 1, further comprising a temperature characteristic improving layer disposed at at least one of an external surface of the laminate, a boundary between adjacent boundary acoustic wave elements, and a location between one of the boundary acoustic wave elements and the external surface of the laminate; wherein
    the temperature characteristic improving layer has a linear expansion coefficient in a direction that is substantially parallel with the boundary plane of the boundary acoustic wave element having the boundary acoustic wave exciting interdigital transducer therein that is less than a linear expansion coefficient of the first and second solid layers, or has a linear expansion coefficient that is different from the linear expansion coefficient of the first and second solid layers in polarity.

14. A boundary acoustic wave device according to claim 1, further comprising:
    a high thermal conductivity layer, disposed at at least one of an external surface of the laminate, a boundary between adjacent boundary acoustic wave elements, and a location between one of the boundary acoustic wave elements and the external surface of the laminate; wherein
    the high thermal conductivity layer has a higher thermal conductivity than an adjacent boundary acoustic wave element.

15. A boundary acoustic wave device according to claim 1, wherein the boundary acoustic wave elements are bonded together by a cavity forming member such that a cavity is provided in at least one boundary between the boundary acoustic wave elements.

16. A boundary acoustic wave device according to claim 1, further comprising a circuit element disposed at at least one of an external surface of the laminate, a boundary between adjacent boundary acoustic wave elements, and a location between one of the boundary acoustic wave elements and the external surface of the laminate.

17. A boundary acoustic wave device according to claim 1, further comprising a base substrate which defines a stress relaxation body and on which the laminate is mounted.

18. A boundary acoustic wave device according to claim 17, wherein the base substrate is made of a material that is harder than the first and second solid layers of the boundary acoustic wave element.

19. A boundary acoustic wave device according to claim 1, wherein the thickness of each of the first and second solid layers is substantially equal to or greater than $\lambda$, where $\lambda$ is the wavelength of a boundary acoustic wave.

20. A method for manufacturing a boundary acoustic wave device, the method comprising:

a step of manufacturing a boundary acoustic wave element by laminating a first solid layer made of a piezoelectric material and a second solid layer made of one of a piezoelectric material and an insulating material, with a boundary acoustic wave exciting interdigital transducer being interposed therebetween; and one of a step of producing a laminate by repeating the step of manufacturing the boundary acoustic wave element to produce a plurality of boundary acoustic wave elements that are then laminated, and a step of producing a laminate by laminating a plurality of boundary acoustic wave elements in said step of manufacturing.

21. A method according to claim 20, further comprising steps of:

disposing an acoustic wave absorbing layer at at least one of an external surface of the laminate, a boundary between adjacent boundary acoustic wave elements, and a location between one of the boundary acoustic wave elements and the external surface of the laminate; and degassing a gas in the acoustic wave absorbing layer when the first and second solid layers are bonded together with the acoustic wave absorbing layer and the boundary acoustic wave exciting interdigital transducer interposed therebetween.

22. A boundary acoustic wave device comprising:

a first solid layer made of a piezoelectric material;

a second solid layer disposed on the first solid layer and made of one of a piezoelectric material and an insulating material;

a boundary acoustic wave exciting interdigital transducer arranged at a boundary between the first and second solid layers; and a surface acoustic wave exciting interdigital transducer disposed on the surface of the first solid layer.

23. A boundary acoustic wave device according to claim 22, wherein the thickness of each of the first and second solid layers is substantially equal to or greater than $\lambda$, where $\lambda$ is the wavelength of a boundary acoustic wave.

* * * * *